(12) United States Patent
Iwamoto et al.

(10) Patent No.: US 11,611,324 B2
(45) Date of Patent: Mar. 21, 2023

(54) ACOUSTIC WAVE DEVICE, HIGH FREQUENCY FRONT END CIRCUIT, AND COMMUNICATION APPARATUS

(71) Applicant: Murata Manufacturing Co., Ltd., Nagaokakyo (JP)

(72) Inventors: Hideki Iwamoto, Nagaokakyo (JP); Tsutomu Takai, Nagaokakyo (JP); Ryo Nakagawa, Nagaokakyo (JP); Takashi Yamane, Nagaokakyo (JP); Masanori Otagawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 838 days.

(21) Appl. No.: 16/562,503

(22) Filed: Sep. 6, 2019

(65) Prior Publication Data

US 2019/0393856 A1 Dec. 26, 2019

Related U.S. Application Data

(63) Continuation of application No. PCT/JP2018/005991, filed on Feb. 20, 2018.

(30) Foreign Application Priority Data

Mar. 9, 2017 (JP) .............................. JP2017-044690

(51) Int. Cl.
 *H03H 9/02* (2006.01)
(52) U.S. Cl.
 CPC ...... *H03H 9/02574* (2013.01); *H03H 9/0222* (2013.01); *H03H 9/02921* (2013.01)

(58) Field of Classification Search
 CPC ............. H03H 9/02574; H03H 9/0222; H03H 9/02921
 See application file for complete search history.

(56) References Cited

U.S. PATENT DOCUMENTS

| 5,998,907 A | 12/1999 | Taguchi et al. |
| 2009/0295508 A1 | 12/2009 | Isobe et al. |

(Continued)

FOREIGN PATENT DOCUMENTS

| JP | 11-55070 A | 2/1999 |
| JP | 2005-347295 A | 12/2005 |

(Continued)

OTHER PUBLICATIONS

Official Communication issued in International Patent Application No. PCT/JP2018/005991 dated May 1, 2018.

*Primary Examiner* — Samuel S Outten

(74) *Attorney, Agent, or Firm* — Keating & Bennett, LLP

(57) ABSTRACT

An acoustic wave device includes a material layer which has Euler angles and an elastic constant at the Euler angles, a piezoelectric body which includes first and second principal surfaces opposing each other, is laminated directly or indirectly on the material layer so that the second principal surface is on the material layer side and has Euler angles, and whose elastic constant at the Euler angles, and an IDT electrode which is disposed on at least one of the first principal surface and the second principal surface of the piezoelectric body. At least one elastic constant among elastic constants $C_{11}$ to $C_{66}$ of the material layer not equal to 0 and at least one elastic constant among elastic constants $C_{11}$ to $C_{66}$ of the piezoelectric body not equal to 0 have opposite signs to each other.

20 Claims, 13 Drawing Sheets

(56) References Cited

U.S. PATENT DOCUMENTS

| | | |
|---|---|---|
| 2010/0182101 A1 | 7/2010 | Suzuki |
| 2014/0152145 A1 | 6/2014 | Kando et al. |
| 2014/0203893 A1 | 7/2014 | Kando et al. |
| 2015/0326200 A1* | 11/2015 | Grannen ............ H03H 9/02102 |
| | | 310/346 |
| 2017/0141750 A1* | 5/2017 | Pelzel ................. H01L 27/0688 |
| 2018/0152170 A1 | 5/2018 | Iwamoto |

FOREIGN PATENT DOCUMENTS

| | | |
|---|---|---|
| JP | 2010-011440 A | 1/2010 |
| JP | 2010-187373 A | 8/2010 |
| JP | 2015-115870 A | 6/2015 |
| WO | 2012/073871 A1 | 6/2012 |
| WO | 2013047433 A1 | 4/2013 |
| WO | 2017/043394 A1 | 3/2017 |

\* cited by examiner

ACOUSTIC WAVE DEVICE, HIGH FREQUENCY FRONT END CIRCUIT, AND COMMUNICATION APPARATUS

CROSS REFERENCE TO RELATED APPLICATIONS

This application claims the benefit of priority to Japanese Patent Application No. 2017-044690 filed on Mar. 9, 2017 and is a Continuation Application of PCT Application No. PCT/JP2018/005991 filed on Feb. 20, 2018. The entire contents of each application are hereby incorporated herein by reference.

BACKGROUND OF THE INVENTION

1. Field of the Invention

The present invention relates to an acoustic wave device including a piezoelectric body made of a single crystal, and a high frequency front end circuit and a communication apparatus including the acoustic wave device.

2. Description of the Related Art

There have been proposed various types of acoustic wave devices in which a piezoelectric body is laminated directly or indirectly on a support substrate made of silicon. For example, in acoustic wave devices described in Japanese Unexamined Patent Application Publication No. 11-55070 and Japanese Unexamined Patent Application Publication No. 2005-347295, a LiTaO$_3$ single crystal piezoelectric body is laminated on a silicon substrate with an SiO$_2$ film interposed therebetween. In an acoustic wave device described in Japanese Unexamined Patent Application Publication No. 2010-187373, a single crystal piezoelectric body made of LiTaO$_3$ is laminated on a (111) plane, (100) plane, or (110) plane of silicon with an SiO$_2$ film interposed therebetween.

In Japanese Unexamined Patent Application Publication No. 2010-187373, it is stated that the heat resistance can be enhanced by using the (111) plane.

In the existing acoustic wave devices as described in Japanese Unexamined Patent Application Publication No. 11-55070, Japanese Unexamined Patent Application Publication No. 2005-347295, and Japanese Unexamined Patent Application Publication No. 2010-187373, energy of the main mode as an acoustic wave to be used can be concentrated in the piezoelectric body. However, it has been found that not only the main mode but also a high-order mode positioned on a higher frequency side relative to the main mode may be confined in the piezoelectric body at the same time. Due to this, the high-order mode produces a spurious emission, thus raising a problem in that the characteristics of the acoustic wave device are deteriorated.

SUMMARY OF THE INVENTION

Preferred embodiments of the present invention provide acoustic wave devices that are each able to reduce or prevent a high-order mode while maintaining preferable characteristics of the main mode.

An acoustic wave device according to a preferred embodiment of the present invention includes a material layer which has Euler angles ($\varphi_1$, $\theta_1$, $\psi_1$) and whose elastic constant at the Euler angles ($\varphi_1$, $\theta_1$, $\psi_1$) is represented by Expression 1 below, a piezoelectric body which includes first and second principal surfaces opposing each other, is laminated directly or indirectly on the material layer so that the second principal surface is on the material layer side and has Euler angles ($\varphi_2$, $\theta_2$, $\psi_2$), and whose elastic constant at the Euler angles ($\varphi_2$, $\theta_2$, $\psi_2$) is represented by the Expression 1 below, and an interdigital transducer (IDT) electrode which is disposed on at least one of the first principal surface and the second principal surface of the piezoelectric body. Further, at least one elastic constant among elastic constants $C_{11}$ to $C_{66}$ of the material layer that is not equal to 0 and at least one elastic constant among elastic constants $C_{11}$ to $C_{66}$ of the piezoelectric body that is not equal to 0 have opposite signs to each other.

$$\begin{pmatrix} C_{11} & C_{12} & C_{13} & C_{14} & C_{15} & C_{16} \\ C_{21} & C_{22} & C_{23} & C_{24} & C_{25} & C_{26} \\ C_{31} & C_{32} & C_{33} & C_{34} & C_{35} & C_{36} \\ C_{41} & C_{42} & C_{43} & C_{44} & C_{45} & C_{46} \\ C_{51} & C_{52} & C_{53} & C_{54} & C_{55} & C_{56} \\ C_{61} & C_{62} & C_{63} & C_{64} & C_{65} & C_{66} \end{pmatrix} \quad \text{Expression 1}$$

In an acoustic wave device according to a preferred embodiment of the present invention, when an elastic constant of the material layer before a rotating operation is defined as $c_{ab}^0$, the elastic constant $c_{ab}$ at the Euler angles ($\varphi_1$, $\theta_1$, $\psi_1$) is determined by an equation of $(c_{ab}) = [\alpha]^{-1} [c_{ab}^0] [\beta]$, and when an elastic constant of the piezoelectric body before a rotating operation is defined as $c_{ab}^1$, the elastic constant $c_{ab}$ of the piezoelectric body at the Euler angles ($\varphi_2$, $\theta_2$, $\psi_2$) is determined by an equation of $(c_{ab}) = [\alpha]^{-1} [c_{ab}^1] [\beta]$.

In the equations, $\alpha$ and $\beta$ are as follows.

$$\alpha = \begin{pmatrix} l_1^2 & l_2^2 & l_3^2 & 2l_2l_3 & 2l_3l_1 & 2l_1l_2 \\ m_1^2 & m_2^2 & m_3^2 & 2m_2m_3 & 2m_3m_1 & 2m_1m_2 \\ n_1^2 & n_2^2 & n_3^2 & 2n_2n_3 & 2n_3n_1 & 2n_1n_2 \\ m_1n_1 & m_2n_2 & m_3n_3 & m_2n_3 + m_3n_2 & m_3n_1 + m_1n_3 & m_1n_2 + m_2n_1 \\ n_1l_1 & n_2l_2 & n_3l_3 & n_2l_3 + n_3l_2 & n_3l_1 + n_1l_3 & n_1l_2 + n_2l_1 \\ l_1m_1 & l_2m_2 & l_3m_3 & l_2m_3 + l_3m_2 & l_3m_1 + l_1m_3 & l_1m_2 + l_2m_1 \end{pmatrix}$$

$$\beta = \begin{pmatrix} l_1^2 & l_2^2 & l_3^2 & l_2l_3 & l_3l_1 & l_1l_2 \\ m_1^2 & m_2^2 & m_3^2 & m_2m_3 & m_3m_1 & m_1m_2 \\ n_1^2 & n_2^2 & n_3^2 & n_2n_3 & n_3n_1 & n_1n_2 \\ 2m_1n_1 & 2m_2n_2 & 2m_3n_3 & m_2n_3 + m_3n_2 & m_3n_1 + m_1n_3 & m_1n_2 + m_2n_1 \\ 2n_1l_1 & 2n_2l_2 & 2n_3l_3 & n_2l_3 + n_3l_2 & n_3l_1 + n_1l_3 & n_1l_2 + n_2l_1 \\ 2l_1m_1 & 2l_2m_2 & 2l_3m_3 & l_2m_3 + l_3m_2 & l_3m_1 + l_1m_3 & l_1m_2 + l_2m_1 \end{pmatrix}$$

Further, $l_1$, $l_2$, $l_3$, $m_1$, $m_2$, $m_3$, $n_1$, $n_2$, and $n_3$ are as follows:

$l_1 = \cos\psi \cos\varphi - \cos\theta \sin\varphi \sin\psi$ $l_2 = -\sin\psi \cos\varphi - \cos\theta \sin\varphi \cos\psi$ $l_3 = \sin\theta \sin\varphi$ $m_1 = \cos\psi \sin\varphi + \cos\theta \cos\varphi \sin\psi$ $m_2 = -\sin\psi \sin\varphi + \cos\theta \cos\varphi \cos\psi$ $m_3 = -\sin\theta \cos\varphi$ $n_1 = \sin\psi \sin\theta$ $n_2 = \cos \psi \sin \theta$ $n_3 = \cos \theta$.

In an acoustic wave device according to a preferred embodiment of the present invention, the elastic constant having the opposite sign is at least one of $C_{41}$ to $C_{43}$, $C_{51}$ to $C_{54}$, $C_{61}$ to $C_{65}$, $C_{14}$, $C_{24}$, $C_{34}$, $C_{15}$, $C_{25}$, $C_{35}$, $C_{45}$, $C_{16}$, $C_{26}$, $C_{36}$, $C_{46}$, and $C_{56}$ in the above Expression 1. In this case, by adjusting $\psi$ of the Euler angles, the sign of the elastic constant is able to be easily inverted.

In an acoustic wave device according to a preferred embodiment of the present invention, the elastic constant having the opposite sign includes the elastic constant $C_{41}$ or $C_{14}$ of the above Expression 1. In this case, a high-order mode is able to be more effectively reduced or prevented.

In an acoustic wave device according to a preferred embodiment of the present invention, the elastic constant having the opposite sign includes the elastic constant $C_{42}$ or $C_{24}$ of the above Expression 1. In this case, a high-order mode is able to be more effectively reduced or prevented.

In an acoustic wave device according to a preferred embodiment of the present invention, the elastic constant having the opposite sign includes the elastic constant $C_{56}$ or $C_{65}$ of the above Expression 1. In this case, a high-order mode is able to be more effectively reduced or prevented.

In an acoustic wave device according to a preferred embodiment of the present invention, at least a portion of a high-order mode excited by the IDT electrode propagates through both of the material layer and the piezoelectric body.

In an acoustic wave device according to a preferred embodiment of the present invention, an absolute value of the elastic constant having the opposite sign is equal to or greater than about 1 GPa.

In an acoustic wave device according to a preferred embodiment of the present invention, the material layer is made of a high acoustic velocity material in which a bulk wave propagates at a higher acoustic velocity than an acoustic velocity of an acoustic wave propagating in the piezoelectric body.

In an acoustic wave device according to a preferred embodiment of the present invention, the material layer is made of a material other than a piezoelectric body.

In an acoustic wave device according to a preferred embodiment of the present invention, the material layer is made of a single crystal. When the material is a single crystal other than a piezoelectric body, since the piezoelectric effect does not occur in the material layer, it is possible to reduce or prevent the generation of an additional high-order mode.

In an acoustic wave device according to a preferred embodiment of the present invention, the piezoelectric body is made of a single crystal.

In an acoustic wave device according to a preferred embodiment of the present invention, the piezoelectric body has a thickness of equal to or smaller than about 10λ. In this case, a high-order mode is able to be more effectively reduced or prevented.

In an acoustic wave device according to a preferred embodiment of the present invention, the piezoelectric body is a piezoelectric substrate.

In an acoustic wave device according to a preferred embodiment of the present invention, the material layer is made of silicon.

An acoustic wave device according to a preferred embodiment of the present invention further includes a low acoustic velocity film which is disposed between the material layer and the piezoelectric body, and in which a bulk wave propagates at a lower acoustic velocity than the acoustic velocity of the acoustic wave propagating in the piezoelectric body. Preferably, the low acoustic velocity film is a silicon oxide film. In this case, it is possible to improve frequency-temperature characteristics.

In an acoustic wave device according to a preferred embodiment of the present invention, the low acoustic velocity film has a thickness of equal to or smaller than about 2λ.

An acoustic wave device according to a preferred embodiment of the present invention further includes a high acoustic velocity film which is laminated between the low acoustic velocity film and the material layer, and in which a bulk wave propagates at a higher acoustic velocity than the acoustic velocity of the acoustic wave propagating in the piezoelectric body. In this case, it is possible to effectively reduce or prevent a high-order mode generated at a frequency position closest to the main mode. Preferably, a silicon nitride film is used as the high acoustic velocity film. More preferably, a film thickness of the silicon nitride film is equal to or greater than about 0.25λ and equal to or smaller than about 0.55λ. In this case, a high-order mode is able to be even more effectively reduced or prevented.

With an acoustic wave devices, a high frequency front end circuits, and a communication apparatuses according to preferred embodiments of the present invention, it is possible to effectively reduce or prevent a high-order mode positioned on a higher frequency side relative to the main mode while maintaining preferable characteristics of the main mode.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described in detail with reference to the accompanying drawings.

It should be noted that the preferred embodiments described herein are illustrative and that a partial substitution or combination of configurations between different preferred embodiments may be possible.

First Preferred Embodiment

Figure 1:
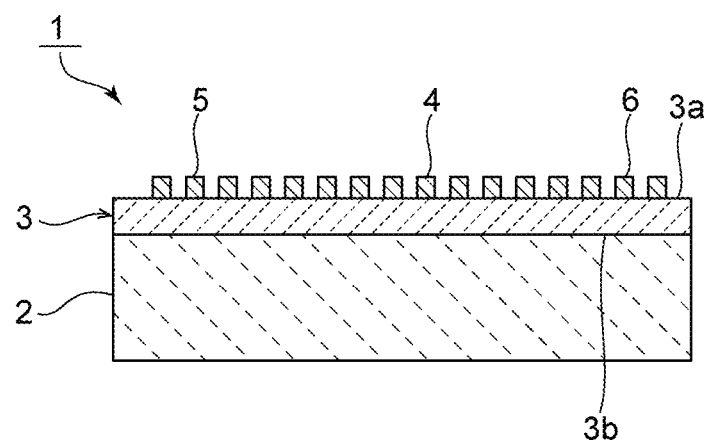
FIG. 1 is a front cross-sectional view of an acoustic wave device according to a first preferred embodiment of the present invention.
Figure 2:
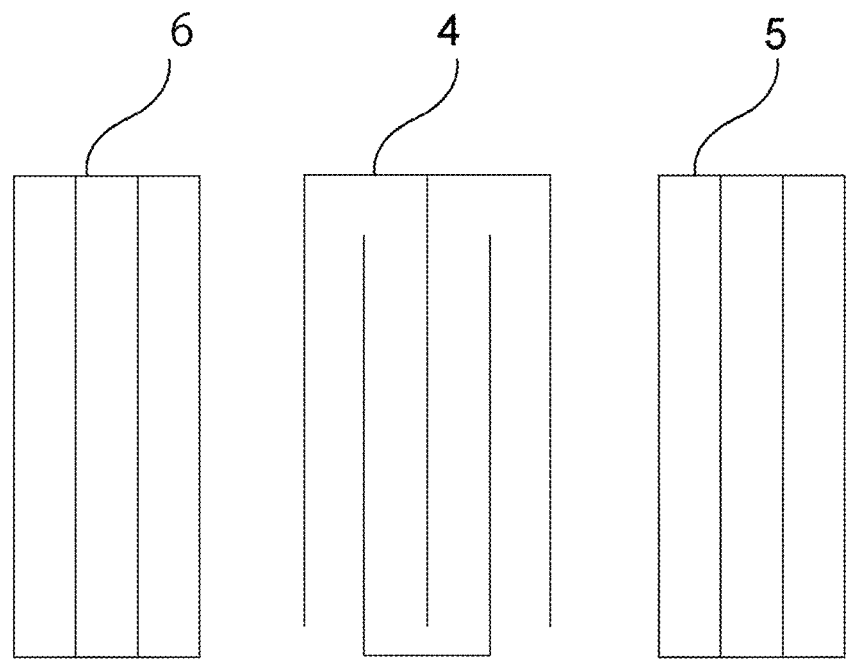
FIG. 2 is a schematic plan view illustrating an electrode structure of the acoustic wave device according to the first preferred embodiment of the present invention.

FIG. 1 is a front cross-sectional view of an acoustic wave device according to a first preferred embodiment of the present invention, and FIG. 2 is a schematic plan view illustrating an electrode structure of the acoustic wave device according to the first preferred embodiment.

An acoustic wave device 1 includes a material layer 2 made of a single crystal. Note that the material layer 2 is preferably a silicon (Si) single crystal, for example. A piezoelectric body 3 made of a single crystal is laminated on the material layer 2. The piezoelectric body 3 is preferably an $Li_2B_4O_7$ single crystal, for example. In the present preferred embodiment, the material layer 2 also defines and functions a support substrate supporting the piezoelectric body 3.

The piezoelectric body 3 includes first and second principal surfaces 3a and 3b opposing each other. The piezoelectric body 3 is preferably directly laminated on the material layer 2 so that the second principal surface 3b contacts the material layer 2 side. An interdigital transducer (IDT) electrode 4 and reflectors 5, 6 are preferably provided on the first principal surface 3a. With the above elements, an acoustic wave resonator is configured in the acoustic wave device 1. The acoustic wave device 1 is preferably a surface acoustic wave device that utilizes a surface acoustic wave propagating in the piezoelectric body 3. Note that, however, in the present invention, the acoustic wave device is not limited to a device utilizing a surface acoustic wave, and it is sufficient that the acoustic wave device is a device utilizing an acoustic wave.

The IDT electrode 4 and the reflectors 5, 6 are preferably made of Al, for example. However, the IDT electrode 4 and the reflectors 5, 6 may be made of other metals. The IDT electrode 4 and the reflectors 5, 6 may be made of a laminated metal film in which a plurality of metal films are laminated.

The piezoelectric body 3 is preferably made of an $Li_2B_4O_7$ single crystal, that is, made of a piezoelectric single crystal. Euler angles of the $Li_2B_4O_7$ single crystal are set to (0°, 45°, 0°). When a wave length determined by an electrode finger pitch of the IDT electrode 4 is defined as λ, the film thickness of the piezoelectric body 3 is preferably about 0.30λ, for example. The film thickness of the IDT electrode 4 is preferably about 0.08λ, for example. In the present preferred embodiment, λ is preferably about 1.0 μm, for example.

The acoustic wave device 1 includes a material layer which has Euler angles ($\varphi_1$, $\theta_1$, $\psi_1$) and whose elastic constant at the Euler angles ($\varphi_1$, $\theta_1$, $\psi_1$) is represented by Expression 1 below, a piezoelectric body which includes first and second principal surfaces opposing each other, is laminated directly or indirectly on the material layer so that the second principal surface is on the material layer side and has Euler angles ($\varphi_2$, $\theta_2$, $\psi_2$), and whose elastic constant at the Euler angles ($\varphi_2$, $\theta_2$, $\psi_2$) is represented by Expression 1 below, and an IDT electrode which is disposed on at least one of the first principal surface and the second principal surface of the piezoelectric body. Further, at least one elastic constant among elastic constants $C_{11}$ to $C_{66}$ of the material layer not equal to 0 and at least one elastic constant among elastic constants $C_{11}$ to $C_{66}$ of the piezoelectric body not equal to 0 have opposite signs to each other. With the above features, the reduction or prevention of the higher-order mode is achieved. This will be described in detail below.

In a case of a single crystal and in a case of a material substantially close to a single crystal, the elastic constant is represented by Expression 1 below in accordance with crystal orientations. Accordingly, the piezoelectric body 3 includes not only a single crystal but also a piezoelectric body in a state substantially close to a single crystal. The material layer 2 includes not only a single crystal but also a material layer in a state substantially close to a single crystal. This applies to all of the preferred embodiments described below.

$$\begin{pmatrix} C_{11} & C_{12} & C_{13} & C_{14} & C_{15} & C_{16} \\ C_{21} & C_{22} & C_{23} & C_{24} & C_{25} & C_{26} \\ C_{31} & C_{32} & C_{33} & C_{34} & C_{35} & C_{36} \\ C_{41} & C_{42} & C_{43} & C_{44} & C_{45} & C_{46} \\ C_{51} & C_{52} & C_{53} & C_{54} & C_{55} & C_{56} \\ C_{61} & C_{62} & C_{63} & C_{64} & C_{65} & C_{66} \end{pmatrix}$$ Expression 1

In a case where an elastic constant after a rotating operation is taken as $c_{ab}$, that is, in a case where an elastic constant at certain Euler angles is taken as $c_{ab}$, the elastic constant $c_{ab}$ is an elastic constant obtained after performing rotation processing corresponding to the three Euler angles with respect to a tensor of the silicon elastic constant, which is generally known. By this coordinate transformation method, the elastic constant in each of crystal orientations is able to be derived.

In other words, when an elastic constant of the material layer before a rotating operation is defined as $c_{ab}^{0}$, the elastic constant $c_{ab}$ at the Euler angles ($\varphi_1$, $\theta_1$, $\psi_1$) is determined by an equation of $(c_{ab})=[\alpha]^{-1} [c_{ab}^{0}] [\beta]$, and when an elastic constant of the piezoelectric body before a rotating operation is defined as $c_{ab}^{1}$, the elastic constant $c_{ab}$ of the piezoelectric body at the Euler angles ($\varphi_2$, $\theta_2$, $\psi_2$) is determined by an equation of $(c_{ab})=[\alpha]^{-1} [c_{ab}^{1}] [\beta]$. The preferred method for the coordinate transformation is described in the document "Acoustic Wave Device Technology Handbook" (150th Committee of Acoustic Wave Device Technology of Japan Society for the Promotion of Science, first edition, first printing, published on Nov. 30, 2001, 549 pages), but any other desired method for the coordinate transformation could be alternatively used.

Figure 3:
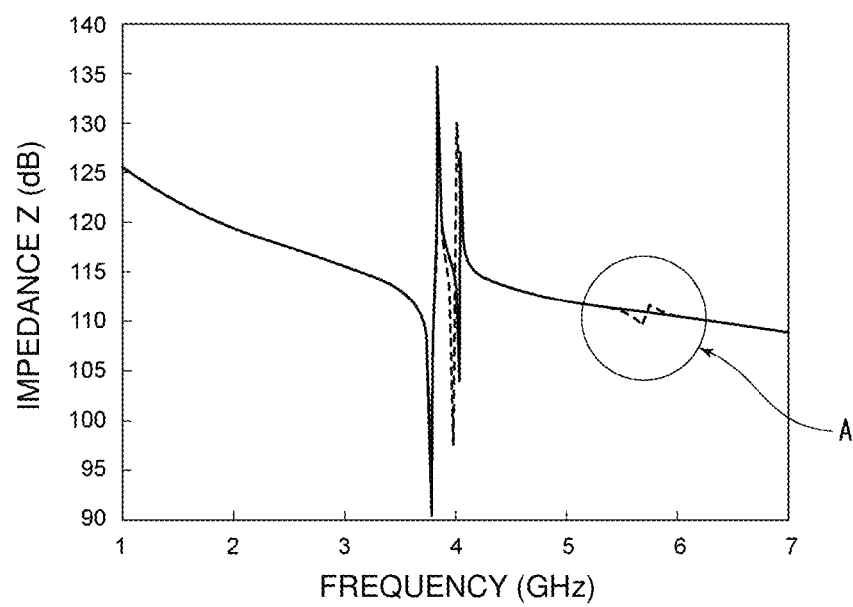
FIG. 3 is a graph showing impedance characteristics of the acoustic wave device of the first preferred embodiment of the present invention and an acoustic wave device of a first comparative example.

A solid line in FIG. 3 indicates impedance characteristics of the acoustic wave device of the present preferred embodiment, and a broken line indicates impedance characteristics of an acoustic wave device of a first comparative example. In the first preferred embodiment, Euler angles of the silicon single crystal defining the material layer 2 are preferably (−45°, −54.7°, 180°). In contrast, in the first comparative example, Euler angles of the silicon single crystal are (−45°, −54.7°, 0°).

Here, a plane designated by φ being about −45° and by θ being about −54.7° represents a (111) plane of silicon. In the present preferred embodiment and the first comparative example, results of two orientations in which ψ is about 180° and about 0° are described respectively, and each of these two orientations corresponds to a structure which is rotated by about 180° within a plane on the silicon (111) plane with respect to the crystal structure of the piezoelectric body to be laminated, and is laminated. Acoustic velocities of the acoustic waves propagating in the silicon of two orientations (−45°, −54.7°, 180°) and (−45°, −54.7°, 0°) are preferably the same or substantially the same. This is because velocities of acoustic waves do not differ between a progressive wave and a regressive wave. In other words, in the two orientations, the absolute values of the elastic constants represented by Expression 1 are the same or substantially the same, but the signs thereof are different.

In FIG. 3, in each of the first preferred embodiment and the first comparative example, a response of the main mode appears near 3.8 GHz. In the first comparative example, a response by a high-order mode appears near 5.7 GHz. In other words, in a portion surrounded by a circle A in FIG. 3, the response of the high-order mode appears in the first comparative example.

Figure 4:
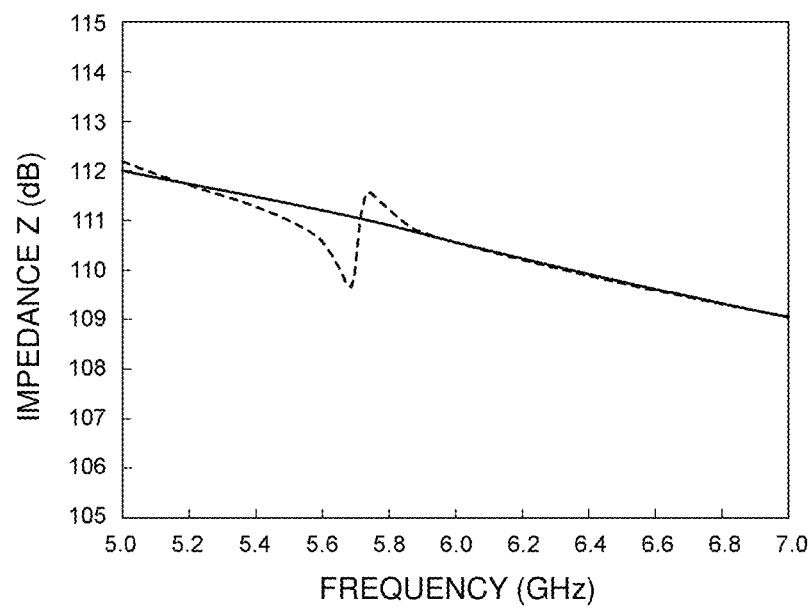
FIG. 4 is a graph in which the vicinity of a portion indicated by a circle A in FIG. 3 is enlarged and illustrated.

FIG. 4 is a graph in which the vicinity of the portion indicated by the circle A in FIG. 3 is enlarged and illustrated. As is apparent from FIGS. 3 and 4, in the first comparative example, the response by the high-order mode appears to be large, whereas in the present preferred embodiment, the response of the high-order mode hardly appears near 5.7 GHz. Therefore, according to the present preferred embodiment, it is understood that a spurious emission by the high-order mode is reduced or prevented so that the deterioration in resonance characteristics is unlikely to occur.

In the two silicon orientations shown in FIGS. 3 and 4, the acoustic velocities of the acoustic waves are preferably the same or substantially the same. In the past, when film thicknesses and materials of a laminated structure were to be designed, the design used to be performed while taking only an acoustic velocity of each layer into consideration. However, from the above described results, it has become apparent that not only the acoustic velocities but also the signs of the elastic constants are parameters that affect the modes of the acoustic wave.

As is apparent from FIG. 3, the magnitude of the response of the main mode in the first preferred embodiment is the same or substantially the same as that in the first comparative example. From this, it is understood that the high-order mode is able to be reduced or prevented while maintaining the characteristics of the main mode.

As described above, in the first preferred embodiment, the reason why the high-order mode is able to be reduced or prevented as compared with the first comparative example will be described below.

The inventors of preferred embodiments of the present invention have found that the excitation of the high-order mode is able to be reduced or prevented by causing the crystal orientation of the piezoelectric body and the crystal orientation of the material layer 2 to fall within a specified region in the structure including the material layer 2 which has Euler angles ($\varphi_1$, $\theta_1$, $\psi_1$) and whose elastic constant at the Euler angles ($\varphi_1$, $\theta_1$, $\psi_1$) is represented by Expression 1, the piezoelectric body which includes first and second principal surfaces opposing each other, is laminated directly or indirectly on the material layer so that the second principal surface is on the material layer side and has Euler angles ($\varphi_2$, $\theta_2$, $\psi_2$), and whose elastic constant at the Euler angles ($\varphi_2$, $\theta_2$, $\psi_2$) is represented by Expression 1, and the IDT electrode which is disposed on at least one of the first principal surface and the second principal surface of the piezoelectric body. Thus, preferred embodiments of the present invention have been developed.

Expression 2 below shows an elastic constant at about 20° C. at Euler angles (0°, 0°, 0°) of $Li_2B_4O_7$.

$$C_{ab} = (\times 10^{11} N/m^2) \begin{pmatrix} 1.267 & 0.05 & 0.3 & 0 & 0 & 0 \\ 0.05 & 1.267 & 0.3 & 0 & 0 & 0 \\ 0.3 & 0.3 & 0.539 & 0 & 0 & 0 \\ 0 & 0 & 0 & 0.550 & 0 & 0 \\ 0 & 0 & 0 & 0 & 0.550 & 0 \\ 0 & 0 & 0 & 0 & 0 & 0.46 \end{pmatrix} \quad \text{Expression 2}$$

The above Expression 2 is described, for example, in the document written by N. M. Shorrocks et al. (Proc. Ultrasonics Symposium (1981)).

When the single crystal orientation is rotated by the rotating operation, the elastic constant represented by the above Expression 1 changes. Table 1 below shows the elastic constant of $Li_2B_4O_7$ as a piezoelectric body when Euler angles are (0°, 45°, 0°). In the following description, the elastic constant represented by Expression 1 is indicated in tabular form as shown in Table 1. In Table 1, numerals 1 to 6 in a vertical axis on the left end represent "a" of $C_{ab}$. Further, numerals 1 to 6 in a row on the upper end represent "b" of $C_{ab}$.

TABLE 1

| | | b | | | | | |
|---|---|---|---|---|---|---|---|
| $C_{ab}$ | | 1 | 2 | 3 | 4 | 5 | 6 |
| a | 1 | 1.3E+11 | 1.8E+10 | 1.8E+10 | 1.3E+10 | 0.0E+00 | 0.0E+00 |
| | 2 | 1.8E+10 | 1.2E+11 | 5.1E+09 | −1.8E+10 | 0.0E+00 | 0.0E+00 |
| | 3 | 1.8E+10 | 5.1E+09 | 1.2E+11 | −1.8E+10 | 0.0E+00 | 0.0E+00 |
| | 4 | 1.3E+10 | −1.8E+10 | −1.8E+10 | 3.0E+10 | 0.0E+00 | 0.0E+00 |
| | 5 | 0.0E+00 | 0.0E+00 | 0.0E+00 | 0.0E+00 | 5.1E+10 | 4.5E+09 |
| | 6 | 0.0E+00 | 0.0E+00 | 0.0E+00 | 0.0E+00 | 4.5E+09 | 5.1E+10 |

As is apparent from Table 1, the values of elastic constants $C_{61}$ to $C_{54}$, $C_{61}$ to $C_{64}$, $C_{15}$, $C_{16}$, $C_{25}$, $C_{26}$, $C_{35}$, $C_{36}$, $C_{45}$, and $C_{46}$ are 0, and the other elastic constants are not 0.

On the other hand, the elastic constant of the silicon single crystal with Euler angles (−45°, −54.7°, 0°) as a material layer is as shown in Table 2 below. Further, the elastic constant of the silicon single crystal as a material layer with Euler angles (−45°, −54.7°, 180°) used in the first comparative example is as shown in Table 3 below.

TABLE 2

| | | b | | | | | |
|---|---|---|---|---|---|---|---|
| $C_{ab}$ | | 1 | 2 | 3 | 4 | 5 | 6 |
| a | 1 | 1.9E+11 | 5.4E+10 | 4.5E+10 | −1.4E+10 | 0.0E+00 | 0.0E+00 |
| | 2 | 5.4E+10 | 1.9E+11 | 4.5E+10 | 1.4E+10 | 0.0E+00 | 0.0E+00 |
| | 3 | 4.5E+10 | 4.5E+10 | 2.0E+11 | 0.0E+00 | 0.0E+00 | 0.0E+00 |
| | 4 | −1.4E+10 | 1.4E+10 | 0.0E+00 | 6.0E+10 | 0.0E+00 | 0.0E+00 |
| | 5 | 0.0E+00 | 0.0E+00 | 0.0E+00 | 0.0E+00 | 6.0E+10 | −1.4E+10 |
| | 6 | 0.0E+00 | 0.0E+00 | 0.0E+00 | 0.0E+00 | −1.4E+10 | 7.0E+10 |

TABLE 3

| | | b | | | | | |
|---|---|---|---|---|---|---|---|
| $C_{ab}$ | | 1 | 2 | 3 | 4 | 5 | 6 |
| a | 1 | 1.9E+11 | 5.4E+10 | 4.5E+10 | 1.4E+10 | 0.0E+00 | 0.0E+00 |
| | 2 | 5.4E+10 | 1.9E+11 | 4.5E+10 | −1.4E+10 | 0.0E+00 | 0.0E+00 |
| | 3 | 4.5E+10 | 4.5E+10 | 2.0E+11 | 0.0E+00 | 0.0E+00 | 0.0E+00 |
| | 4 | 1.4E+10 | −1.4E+10 | 0.0E+00 | 6.0E+10 | 0.0E+00 | 0.0E+00 |
| | 5 | 0.0E+00 | 0.0E+00 | 0.0E+00 | 0.0E+00 | 6.0E+10 | 1.4E+10 |
| | 6 | 0.0E+00 | 0 0E+00 | 0.0E+00 | 0.0E+00 | 1.4E+10 | 7.0E+10 |

When the above Table 1 describing the elastic constant of the piezoelectric body 3 of the first preferred embodiment and the above Table 2 describing the elastic constant of the material layer 2 of the first preferred embodiment are compared with each other, the signs of positive and negative of elastic constants $C_{41}$, $C_{42}$ and $C_{65}$, and elastic constants $C_{14}$, $C_{24}$ and $C_{56}$ at symmetrical positions relative to elastic constants are inverted between the $Li_2B_4O_2$ and the silicon single crystal.

On the other hand, as is apparent from the comparison between the above Table 1 describing the elastic constant of the piezoelectric body 3 of the first comparative example and the above Table 3 describing the elastic constant of the material layer 2 of the first comparative example, it is understood that, in the first comparative example, the signs of $C_{41}$, $C_{42}$ and $C_{65}$, and the elastic constants $C_{14}$, $C_{24}$ and $C_{56}$ at symmetrical positions relative to the constants $C_{41}$, $C_{42}$ and $C_{65}$ are not inverted between the $Li_2B_4O_7$ and the silicon single crystal, that is, the signs are the same. In Tables 1 and 3, all of the signs of the elastic constants not equal to 0 are the same.

In the present preferred embodiment, at least one elastic constant not equal to 0 among the elastic constants $C_{11}$ to $C_{66}$ of the material layer 2 and at least one elastic constant not equal to 0 among the elastic constants $C_{11}$ to $C_{66}$ of the piezoelectric body 3 have opposite signs to each other. With the above configuration, the high-order mode is reduced or prevented. The reason for this may be as follows.

First, in a structure in which the piezoelectric body 3 made of a single crystal or a material close to a single crystal and the material layer 2 made of a single crystal or a material close to a single crystal are directly or indirectly laminated, a high-order mode determined by both film thicknesses thereof is generated. Due to this high-order mode, a stress caused by the high-order mode is generated in a surface of the material layer 2 on the piezoelectric body 3 side, among the surfaces of the material layer 2. Due to this stress, it is considered that displacement is generated in the material layer 2 and the high-order mode shown in FIG. 3 is excited. On the other hand, when the elastic constants having the opposite signs exist between the piezoelectric body 3 and the material layer 2, the material layer 2 is displaced in the opposite direction to a direction of the stress applied from the piezoelectric body 3 side. With this, it is considered that the excitation of the high-order mode is reduced or prevented and the higher-order mode is reduced or prevented.

Therefore, as in the present preferred embodiment, it is sufficient that, among the elastic constants $C_{11}$ to $C_{66}$ in Expression 1 of the piezoelectric body 3 and the material layer 2, at least one elastic constant not equal to 0 is inverted between the piezoelectric body 3 and the material layer 2.

The sign of the elastic constant not equal to 0, that is, whether the elastic constant not equal to 0 becomes positive or negative may be adjusted by changing the crystal orientations. As described above, in the case of the first comparative example of Euler angles (−45°, −54.7°, 180°) in the material layer 2, by adjusting the crystal orientations so that ψ of the Euler angles becomes 0°, it is possible to invert the sign of $C_{41}$, $C_{42}$ and $C_{56}$, with respect to elastic constants at symmetrical positions relative to the above $C_{41}$, $C_{42}$ and $C_{56}$, as in the case of the first preferred embodiment.

It is preferable that, among the elastic constants in Expression 1, such elastic constants that the elastic constant of the piezoelectric body 3 and the elastic constant of the material layer 2 have the opposite signs to each other are at least one of $C_{41}$ to $C_{43}$, $C_{51}$ to $C_{54}$ and $C_{61}$ to $C_{65}$, and the elastic constants at symmetrical positions relative to the above $C_{41}$ to $C_{43}$, $C_{51}$ to $C_{54}$ and $C_{61}$ to $C_{65}$. This is because it is possible to easily invert the signs of these elastic constants by the adjustment of the crystal orientations.

In addition, when the crystal orientations of the material layer 2 are adjusted, the acoustic velocity of the acoustic wave propagating in the material layer 2 may change, but the acoustic velocity of the acoustic wave propagating in the material layer 2 is sufficiently larger than the acoustic velocity of the main mode. Therefore, as described above, the main mode in which a large amount of energy exists in the piezoelectric body 3 is not significantly affected. Because of this, the high-order mode is able to be independently reduced or prevented while maintaining the characteristics by the response of the main mode.

As described above, the reduction or prevention of the higher-order mode in the structure in which the piezoelectric body 3 made of a single crystal or a material close to a single crystal is laminated on the material layer 2 made of a single crystal or a material close to a single crystal, is able to be achieved by adjusting the sign of the elastic constant of the material layer 2 and the sign of the elastic constant of the piezoelectric body 3. That is, the reduction or prevention of the high-order mode in the structure in which the piezoelectric body 3 which has Euler angles ($\varphi_2$, $\theta_2$, $\psi_2$) and whose elastic constant at the Euler angles ($\varphi_2$, $\theta_2$, $\psi_2$) is represented by Expression 1 is laminated on the material layer 2 which has Euler angles ($\varphi_1$, $\theta_1$, $\psi_1$) and whose elastic constant at the Euler angles ($\varphi_1$, $\theta_1$, $\psi_1$) is represented by Expression 1, is able to be achieved by adjusting the sign of the elastic constant of the material layer 2 and the sign of the elastic constant of the piezoelectric body 3.

Figure 5:
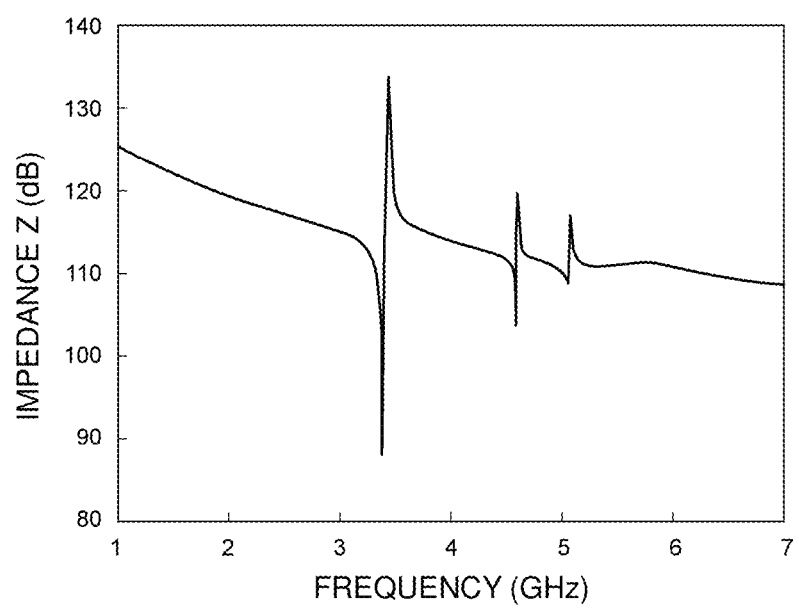
FIG. 5 is a graph showing impedance characteristics of an acoustic wave device when Euler angles of a silicon single crystal are (−45°, −54.7°, 180°) and (−45°, −54.7°, 0°) in the case where Euler angles of $Li_2B_4O_7$ are (0°, 0°, 0°).

FIG. 5 shows impedance characteristics of the case in which crystal orientations of $Li_2B_4O_7$ are (0°, 0°, 0°) in Euler angles, and crystal orientations of a silicon single crystal are (−45°, −54.7°, 180°) and (−45°, −54.7°, 0°) in Euler angles. That is, the crystal orientations of the silicon single crystal are the same or substantially the same as those in the first preferred embodiment and the first comparative example. However, when the crystal orientations of $Li_2B_4O_7$ are (0°, 0°, 0°), the elastic constants $C_{41}$, $C_{42}$ and $C_{65}$, and the elastic constants at symmetrical positions relative to the above $C_{41}$, $C_{42}$ and $C_{65}$ are 0, as described in Expression 2. Therefore, as shown in FIG. 5, the response of the high-order mode is not reduced or prevented.

In FIG. 5, the case where the crystal orientations of the silicon single crystal are (−45°, −54.7°, 180°) is indicated by a solid line, and the case where the crystal orientations are (−45°, −54.7°, 0°) is indicated by a broken line. However, in reality, the solid line and the broken line overlap or substantially overlap each other. As such, in any of the cases of crystal orientations of the silicon single crystal, the sign of the elastic constant not equal to 0 is not inverted with respect to the sign of the elastic constant of the $Li_2B_4O_7$ single crystal. Accordingly, the reduction or prevention of the high-order mode is not achieved.

That is, in preferred embodiments of the present invention, at least one of the elastic constants $C_{51}$ to $C_{54}$, $C_{61}$ to $C_{64}$, $C_{15}$, $C_{16}$, $C_{25}$, $C_{26}$, $C_{35}$, $C_{36}$, $C_{45}$, and $C_{46}$ is required to be not equal to 0, as discussed above.

Second Preferred Embodiment

In a second preferred embodiment of the present invention, similarly to the first preferred embodiment, the piezoelectric body 3 made of a single crystal or a material close to a single crystal is laminated on the material layer 2 made of a single crystal or a material close to a single crystal. In other words, the piezoelectric body 3 which has Euler angles ($\varphi_2$, $\theta_2$, $\psi_2$) and whose elastic constant at the Euler angles ($\varphi_2$, $\theta_2$, $\psi_2$) is represented by Expression 1 is laminated on the material layer 2 which has Euler angles ($\varphi_1$, $\theta_1$, $\psi_1$) and whose elastic constant at the Euler angles ($\varphi_1$, $\theta_1$, $\psi_1$) is represented by Expression 1. Note that, in the second preferred embodiment, the piezoelectric body is preferably made of LiTaO$_3$, a film thickness thereof is preferably about 0.30$\lambda$, and a Y cut-angle is preferably about 50°, for example. Accordingly, the Euler angles of LiTaO$_3$ are determined to be (0°, 140°, 0°).

Other elements, that is, a material of an IDT electrode, a film thickness thereof, a film thickness of the piezoelectric body, and $\lambda$ are preferably the same or substantially the same as those of the first preferred embodiment.

In the second preferred embodiment, the crystal orientations of the material layer made of a silicon single crystal are determined to be (−45°, −54.7°, 180°) in Euler angles. Furthermore, an acoustic wave device of a third preferred embodiment of the present invention is preferably configured in the same or substantially the same manner as an acoustic wave device of the second preferred embodiment except for including a material layer in which the crystal orientations of a silicon single crystal are (−45°, −54.7°, 0°) in Euler angles.

The elastic constant of a silicon single crystal as the material layer with the Euler angles (−45°, −54.7°, 180°) is shown in Table 4 below.

In addition, the elastic constant of a silicon single crystal as a material layer with Euler angles (−45°, −54.7°, 0°) is shown in Table 5 below.

The elastic constant of LiTaO$_3$ as a piezoelectric body at Euler angles (0°, 140°, 0°) is shown in Table 6 below.

TABLE 4

| $C_{ab}$ | | b=1 | b=2 | b=3 | b=4 | b=5 | b=6 |
|---|---|---|---|---|---|---|---|
| a | 1 | 1.9E+11* | 5.4E+10* | 4.5E+10* | 1.4E+10 | 0.0E+00 | 0.0E+00 |
|   | 2 | 5.4E+10* | 1.9E+11* | 4.5E+10* | −1.4E+10 | 0.0E+00 | 0.0E+00 |
|   | 3 | 4.5E+10* | 4.5E+10* | 2.0E+11* | 0.0E+00 | 0.0E+00 | 0.0E+00 |
|   | 4 | 1.4E+10 | −1.4E+10 | 0.0E+00 | 6.0E+10* | 0.0E+00 | 0.0E+00 |
|   | 5 | 0.0E+00 | 0.0E+00 | 0.0E+00 | 0.0E+00 | 6.0E+10* | 1.4E+10 |
|   | 6 | 0.0E+00 | 0.0E+00 | 0.0E+00 | 0.0E+00 | 1.4E+10 | 7.0E+10* |

TABLE 5

| $C_{ab}$ | | b=1 | b=2 | b=3 | b=4 | b=5 | b=6 |
|---|---|---|---|---|---|---|---|
| a | 1 | 1.9E+11* | 5.4E+10* | 4.5E+10* | −1.4E+10 | 0.0E+00 | 0.0E+00 |
|   | 2 | 5.4E+10* | 1.9E+11* | 4.5E+10* | 1.4E+10 | 0.0E+00 | 0.0E+00 |
|   | 3 | 4.5E+10* | 4.5E+10* | 2.0E+11* | 0.0E+00 | 0.0E+00 | 0.0E+00 |
|   | 4 | −1.4E+10 | 1.4E+10 | 0.0E+00 | 6.0E+10* | 0.0E+00 | 0.0E+00 |
|   | 5 | 0.0E+00 | 0.0E+00 | 0.0E+00 | 0.0E+00 | 6.0E+10* | −1.4E+10 |
|   | 6 | 0.0E+00 | 0.0E+00 | 0.0E+00 | 0.0E+00 | −1.4E+10 | 7.0E+10* |

TABLE 6

| $C_{ab}$ | | b=1 | b=2 | b=3 | b=4 | b=5 | b=6 |
|---|---|---|---|---|---|---|---|
| a | 1 | 2.3E+11 | 7.0E+10 | 5.6E+10 | −2.0E+10 | 0.0E+00 | 0.0E+00 |
|   | 2 | 7.0E+10 | 2.5E+11 | 7.3E+10 | −1.8E+10 | 0.0E+00 | 0.0E+00 |
|   | 3 | 5.6E+10 | 7.3E+10 | 2.8E+11 | −4.8E+09 | 0.0E+00 | 0.0E+00 |
|   | 4 | −2.0E+10 | −1.8E+10 | −4.8E+09 | 8.9E+10 | 0.0E+00 | 0.0E+00 |
|   | 5 | 0.0E+00 | 0.0E+00 | 0.0E+00 | 0.0E+00 | 8.5E+10 | −3.7E+09 |
|   | 6 | 0.0E+00 | 0.0E+00 | 0.0E+00 | 0.0E+00 | −3.7E+09 | 1.0E+11 |

Figure 6:
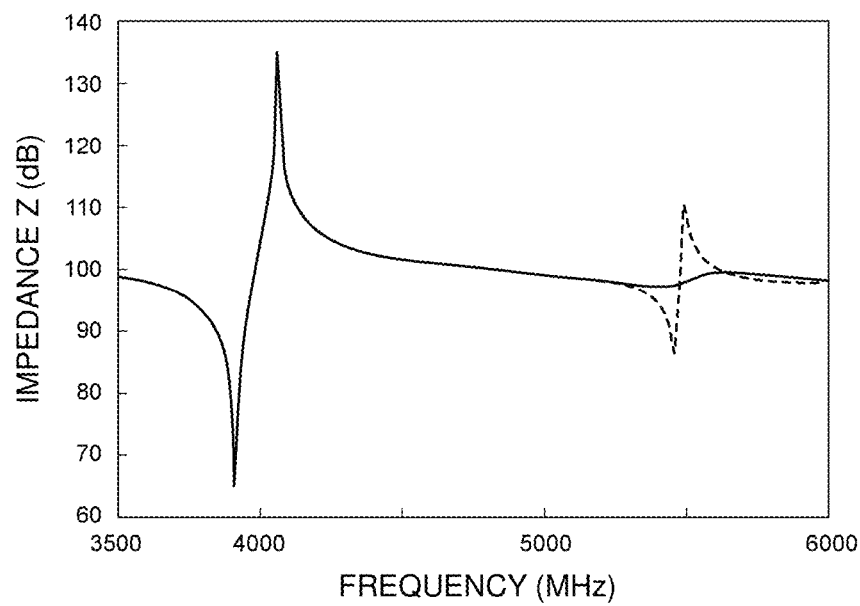
FIG. 6 is a graph showing impedance characteristics of an acoustic wave device of a second preferred embodiment and an acoustic wave device of a third preferred embodiment of the present invention.

Impedance characteristics of the second preferred embodiment and the third preferred embodiment are shown in FIG. 6. In FIG. 6, a solid line indicates a result of the second preferred embodiment, and a broken line indicates a result of the third preferred embodiment. As is apparent from FIG. 6, according to the second preferred embodiment, a high-order mode appearing near about 5400 MHz is even more effectively reduced or prevented in comparison with the third preferred embodiment.

Figure 7:
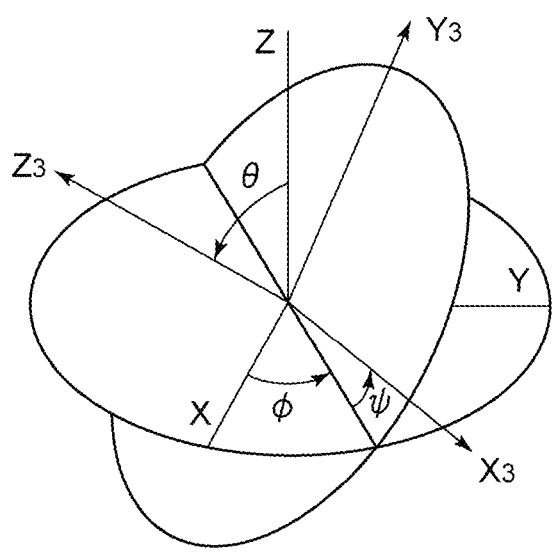
FIG. 7 is a schematic diagram illustrating a relationship between a coordinate system (X, Y, Z) and Euler angles (φ, θ, ψ).

FIG. 7 is a schematic diagram illustrating a relationship between a coordinate system (X, Y, Z) and Euler angles ($\varphi$, $\theta$, $\psi$).

Figure 21:
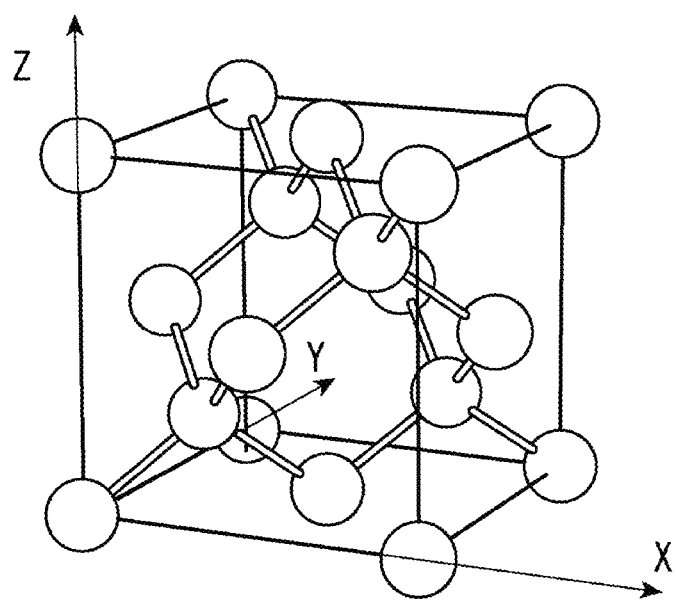
FIG. 21 is a schematic diagram that explains a definition of a crystal orientation of silicon.

In the present specification, as Euler angles ($\varphi$, $\theta$, $\psi$), used are the right-handed Euler angles described in, for example, the document "Acoustic Wave Device Technology Handbook" (150th Committee of Acoustic Wave Device Technology of Japan Society for the Promotion of Science, first edition, first printing, published on Nov. 30, 2001, 549 pages). A case of silicon will be exemplified and explained, in which the crystal axes of the silicon are defined as an X-axis, a Y-axis and a Z-axis, as illustrated in FIG. 21. Euler angles ($\varphi$, $\theta$, $\psi$) can be described as follows. The rotational direction of a right-hand screw is taken as a positive direction, as illustrated in FIG. 7, (1) the (X, Y, Z) are rotated about the Z-axis by "$\varphi$" so as to be ($X_1$, $Y_1$, $Z_1$), and (2) the ($X_1$, $Y_1$, $Z_1$) are rotated about the $X_1$-axis by "$\theta$" so as to be ($X_2$, $Y_2$, $Z_2$) next. The plane taking the $Z_2$-axis as a normal line is a material layer or a principal surface of a piezoelectric body. Further, (3) the ($X_2$, $Y_2$, $Z_2$) are rotated about the $Z_2$-axis by "$\psi$" so as to be ($X_3$, $Y_3$, $Z_3$). At this time, the above-discussed rotating operations are represented as ($\varphi$, $\theta$, $\psi$) in Euler angles.

The elastic constant represented by Expression 1 refers to an elastic constant obtained in the following manner: with respect to a documented value of the elastic constant of the material layer or the piezoelectric body, coordinate transformation is performed on the elastic constant by the above rotating operations, and thereafter the elastic constant represented by Expression 1 is obtained. Therefore, even in the case where the same material is used, each component of the elastic constant may have various values and signs depending on the Euler angles in use.

Figure 25:
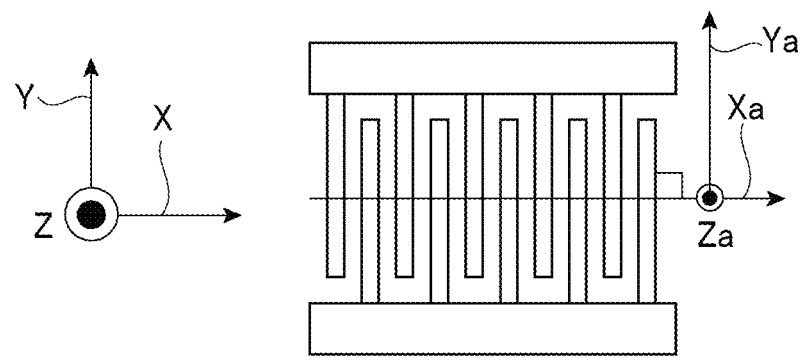
FIG. 25 is a diagram illustrating a relationship between coordinate axes of a material layer and a piezoelectric body when Euler angles of each of the material layer and the piezoelectric body are (0°, 0°, 0°).

FIG. 25 illustrates a relationship between the coordinate axes of a material layer and a piezoelectric body, when Euler angles of each of the material layer and the piezoelectric body are (0°, 0°, 0°). The X-axis, Y-axis, and Z-axis in FIG. 25 are crystal axes of the material layer, and the Xa-axis, Ya-axis, and Za-axis in FIG. 25 are crystal axes of the piezoelectric body. When the Euler angles are (0°, 0°, 0°), as illustrated in FIG. 25, X and Xa, Y and Ya, and Z and Za are respectively defined to indicate the same directions. When the acoustic wave propagating in the piezoelectric body is an X propagation wave, the Xa direction and the IDT electrode are perpendicular or substantially perpendicular to each other.

Among the elastic constant $C_{ab}$, stress $T_a$, and strain $S_b$, there is a relationship as represented by Expression 3 below.

$$\begin{pmatrix} T_1 \\ T_2 \\ T_3 \\ T_4 \\ T_5 \\ T_6 \end{pmatrix} = \begin{pmatrix} C_{11} & C_{12} & C_{13} & C_{14} & C_{15} & C_{16} \\ C_{21} & C_{22} & C_{23} & C_{24} & C_{25} & C_{26} \\ C_{31} & C_{32} & C_{33} & C_{34} & C_{35} & C_{36} \\ C_{41} & C_{42} & C_{43} & C_{44} & C_{45} & C_{46} \\ C_{51} & C_{52} & C_{53} & C_{54} & C_{55} & C_{56} \\ C_{61} & C_{62} & C_{63} & C_{64} & C_{65} & C_{66} \end{pmatrix} \begin{pmatrix} S_1 \\ S_2 \\ S_3 \\ S_4 \\ S_5 \\ S_6 \end{pmatrix} \quad \text{Expression 3}$$

In Tables 4 and 5, the number of significant digits of each elastic constant is two.

In addition, the elastic constant whose absolute value is equal to or smaller than about $1\times10^9$ N/m$^2$ is regarded as 0 because the value itself is small and the influence thereof on the high-order mode is small. Conversely, in order to obtain the advantageous effect of reducing or preventing the higher-order mode by preferred embodiments of the present invention, it is possible to invert the sign of the elastic constant whose absolute value is equal to or greater than about $1\times10^9$ N/m$^2$.

Note that, in the columns marked with "*" in Table 4 and Table 5, the value of each elastic constant is not changed by rotating $\psi$ by about 180°. On the other hand, as for the remaining elastic constants not equal to 0, when $\psi$ is rotated by about 180°, the absolute values thereof are not changed but the signs thereof are changed. The elastic constants whose signs are changed include $C_{41}$, $C_{42}$ and $C_{65}$, and $C_{14}$, $C_{24}$ and $C_{56}$ at symmetrical positions relative to the above elastic constants, for example.

Further, the signs of the elastic constants $C_{41}$ (=$C_{14}$), $C_{42}$ (=$C_{24}$), and $C_{65}$ (=$C_{56}$) of a silicon single crystal are as shown in Table 7 below, in the cases where the crystal orientations of the silicon single crystal are (−45°, −54.7°, 0°) and (−45°, 54.7°, 180°).

TABLE 7

| Si | (−45°, −54.7°, 0°) | (−45°, −54.7°, 180°) |
|---|---|---|
| $C_{41}$ (=$C_{14}$) | Negative | Positive |
| $C_{42}$ (=$C_{24}$) | Positive | Negative |
| $C_{65}$ (=$C_{56}$) | Negative | Positive |

On the other hand, the Euler angles of LiTaO$_3$ are (0°, 140°, 0°), and in this case, the elastic constant of LiTaO$_3$ is as shown in Table 8 below. That is, the elastic constants of the piezoelectric bodies in the second preferred embodiment and the third preferred embodiment are as shown in Table 8.

TABLE 8

| | | b | | | | | |
|---|---|---|---|---|---|---|---|
| $C_{ab}$ | | 1 | 2 | 3 | 4 | 5 | 6 |
| a | 1 | 2.3E+11 | 7.0E+10 | 5.6E+10 | −2.0E+10 | 0.0E+00 | 0.0E+00 |
| | 2 | 7.0E+10 | 2.5E+11 | 7.3E+10 | −1.8E+10 | 0.0E+00 | 0.0E+00 |
| | 3 | 5.6E+10 | 7.3E+10 | 2.8E+11 | −4.8E+09 | 0.0E+00 | 0.0E+00 |
| | 4 | −2.0E+10 | −1.8E+10 | −4.8E+09 | 8.9E+10 | 0.0E+00 | 0.0E+00 |
| | 5 | 0.0E+00 | 0.0E+00 | 0.0E+00 | 0.0E+00 | 8.5E+10 | −3.7E+09 |
| | 6 | 0.0E+00 | 0.0E+00 | 0.0E+00 | 0.0E+00 | −3.7E+09 | 1.0E+11 |

Accordingly, the signs of $C_{41}$ (=$C_{14}$), $C_{42}$ (=$C_{24}$), and $C_{65}$ (=$C_{56}$) in Table 8 are as shown in Table 9 given below.

TABLE 9

| LiTaO$_3$ | (0°, 140°, 0°) |
|---|---|
| $C_{41}$ (=$C_{14}$) | Negative |
| $C_{42}$ (=$C_{24}$) | Negative |
| $C_{65}$ (=$C_{56}$) | Negative |

That is, when the crystal orientations of the silicon single crystal are (−45°, −54.7°, 180°) in Euler angles, the signs of $C_{41}$ and $C_{66}$ are inverted as compared with those in the case of (−45°, −54.7°, 0°).

Figure 8:
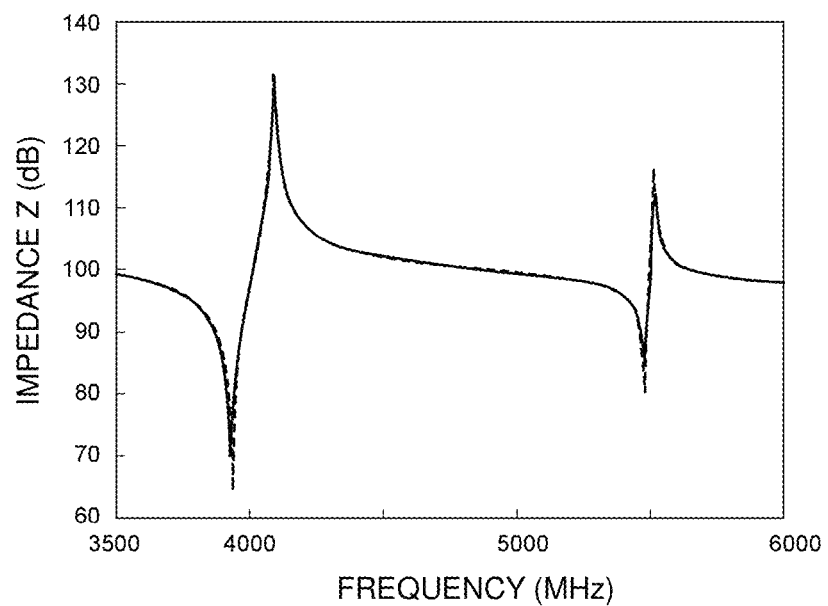
FIG. 8 is a graph showing impedance characteristics of an acoustic wave device in which a sign of an elastic constant $C_{41}$ of a support substrate made of a silicon single crystal is inverted with respect to a sign of an elastic constant $C_{41}$ of a piezoelectric single crystal made of lithium tantalate, and impedance characteristics of an acoustic wave device in which the sign is not inverted.
Figure 9:
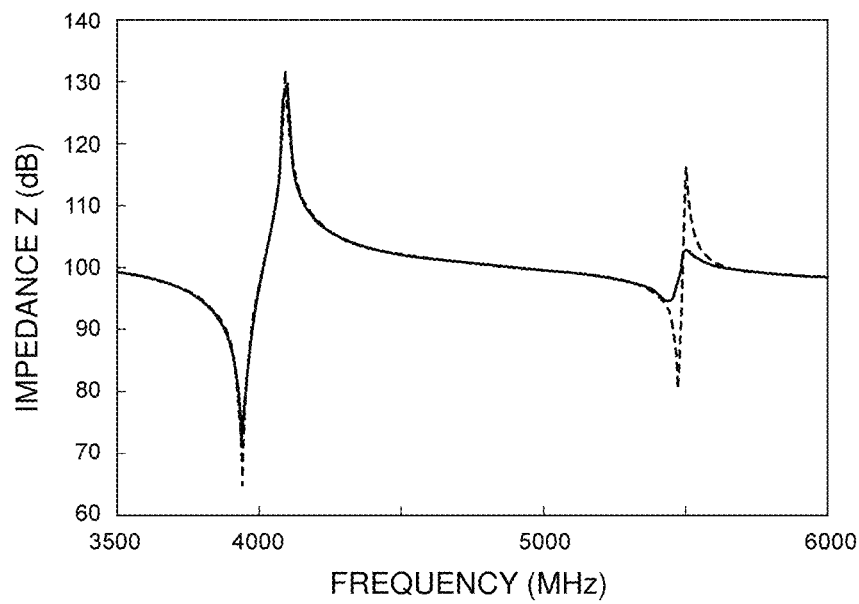
FIG. 9 is a graph showing impedance characteristics of an acoustic wave device in which a sign of an elastic constant $C_{42}$ of a substrate made of a silicon single crystal is inverted with respect to a sign of an elastic constant $C_{42}$ of a piezoelectric single crystal made of lithium tantalate, and impedance characteristic of an acoustic wave device in which the sign is not inverted.
Figure 10:
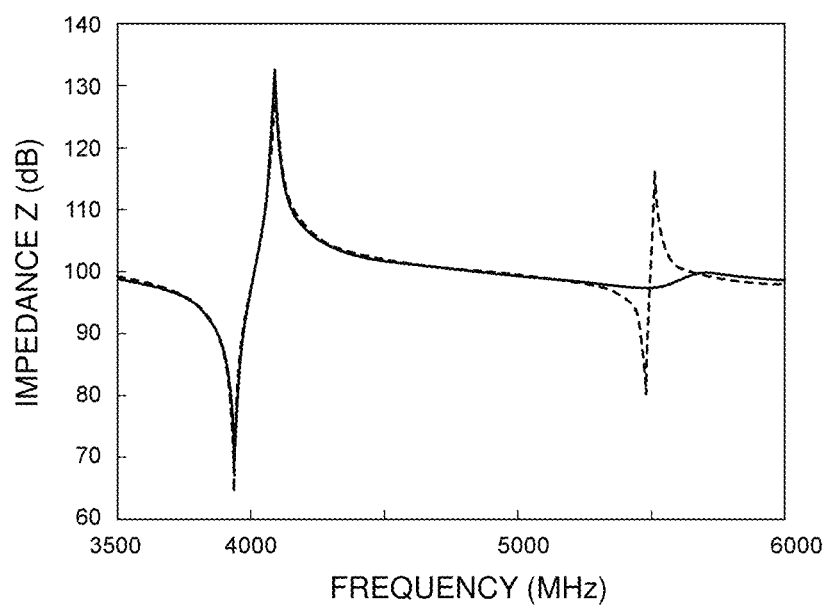
FIG. 10 is a graph showing impedance characteristics of an acoustic wave device in which a sign of an elastic constant $C_{56}$ of a substrate made of a silicon single crystal is inverted with respect to a sign of an elastic constant $C_{56}$ of a piezoelectric single crystal made of lithium tantalate, and impedance characteristic of an acoustic wave device in which the sign is not inverted.

Each of FIGS. 8 to 10 shows impedance characteristics when only one elastic constant among the elastic constants $C_{41}$ to $C_{43}$, $C_{51}$ to $C_{54}$ and $C_{61}$ to $C_{66}$, and the elastic constants at symmetrical positions relative to the above elastic constants is inverted between the elastic constants of the piezoelectric body and the material layer 2. Evaluations were performed by appropriately changing the values of $C_{41}$ (=$C_{14}$), $C_{42}$ (=$C_{24}$), and $C_{66}$ (=$C_{56}$) using the same or substantially the same structure as that described in the second preferred embodiment, in which the elastic constant when Euler angles of LiTaO$_3$ were (0°, 140°, 0°) and Euler angles of silicon were (−45°, −54.7°, 0°) was taken as a reference. In the structure used as the reference, all of the signs of the elastic constant of LiTaO$_3$ and the elastic constant of silicon were the same or substantially the same. A waveform of the structure used as the reference is indicated by a broken line in FIGS. 8 to 10.

In FIG. 8, a solid line shows the impedance characteristics of the acoustic wave device when only the elastic constant $C_{41}$ (=$C_{14}$) of the piezoelectric body 3 and elastic constant $C_{41}$ (=$C_{14}$) of the material layer 2 have the opposite signs to each other, and a broken line shows the impedance characteristics of the acoustic wave device when the elastic constants $C_{41}$ (=$C_{14}$) thereof have the same sign. As shown in FIG. 8, it is understood that a high-order mode is slightly reduced or prevented by the inversion of the sign.

In FIG. 9, a solid line shows the impedance characteristics of the acoustic wave device when only the elastic constant $C_{42}$ (=$C_{24}$) of the piezoelectric body 3 and elastic constant $C_{41}$ (=$C_{14}$) of the material layer 2 have the opposite signs to each other. A broken line shows the impedance characteristics of the acoustic wave device when the elastic constants $C_{42}$ (=$C_{24}$) thereof have the same sign.

In FIG. 10, a solid line shows the impedance characteristics of the acoustic wave device when only the elastic constant $C_{56}$ (=$C_{65}$) of the piezoelectric body 3 and elastic constant $C_{41}$ (=$C_{14}$) of the material layer 2 have the opposite signs to each other. Also in FIG. 10, a broken line shows the impedance characteristics of the acoustic wave device when the signs of the elastic constants $C_{56}$ (=$C_{65}$) thereof are not inverted.

As is apparent from FIG. 9, when only the elastic constant $C_{42}$ of the piezoelectric body 3 and elastic constant $C_{41}$ (=$C_{14}$) of the material layer 2 have the opposite signs to each other, it is understood that the high-order mode is able to be effectively reduced or prevented. Further, as shown in FIG. 10, when the sign of the elastic constant $C_{56}$ is inverted, it is understood that the high-order mode is able to be even more effectively reduced or prevented, and the response by the high-order mode does not substantially appear.

Therefore, the following can be understood: it is most preferable to invert the sign of the elastic constant $C_{56}$ (=$C_{65}$) among the elastic constants $C_{41}$, $C_{42}$ and $C_{56}$, and it is second most preferable to make the elastic constants $C_{42}$ (=$C_{24}$) have the opposite sign.

Accordingly, in preferred embodiments of the present invention, it is preferable that the elastic constants expected to have the opposite signs include, among the elastic constants of the piezoelectric body 3 and the material layer 2, the elastic constant $C_{41}$, it is more preferable to include the elastic constant $C_{42}$, and it is even more preferable to include the elastic constant $C_{56}$ or $C_{65}$, for example.

In the first preferred embodiment and the second preferred embodiment, the material layer 2 is preferably made of a silicon single crystal, but the same or substantially the same advantageous effects may be achieved by using other single crystal materials such as sapphire, diamond, SiC, GaN, AlN, GaAs, and various metal materials, for example. In addition, without being limited to the single crystal, the same or substantially the same advantageous effects may be achieved when the material layer 2 is made of a material whose elastic constant is represented by Expression 1. In the case of silicon, thermal conductivity is high and heat dissipation is favorable. Further, a thermal linear expansion coefficient is small, and temperature characteristics are able to be improved. It is preferable that processing, such as cutting with a dicing machine, be favorably carried out, and that the material layer be made of silicon.

However, it is preferable for the material layer to be made of a single crystal, and it is more preferable for the material layer to be made of a single crystal other than a piezoelectric body. In the case of the piezoelectric body, there is a risk of generating a new high-order mode due to the piezoelectric effect. In contrast, by using a material layer made of a single crystal other than a piezoelectric body, being affected by such additional high-order mode is unlikely to occur.

In the first and second preferred embodiments, Li$_2$B$_4$O$_7$ or LiTaO$_3$ is preferably used, but the piezoelectric single crystal defining the piezoelectric body is not limited thereto.

Third Preferred Embodiment

In the third preferred embodiment, a material layer having an imaginary elastic constant in which only the value of an elastic constant $C_{56}$ (=$C_{65}$) was varied with respect to the elastic constant in the case of Euler angles of a silicon single crystal being (−45°, −54.7°, 0°) was used. Other components are preferably the same or substantially the same as those in the second preferred embodiment.

In this case, the value of $C_{56}$ (=$C_{65}$) was varied in various manners.

Figure 11:
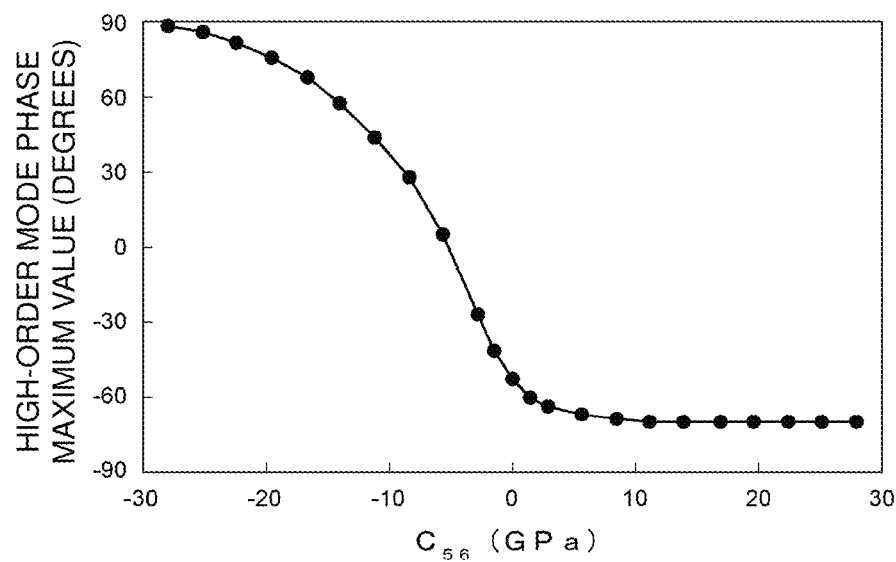
FIG. 11 is a graph showing a relationship between the magnitude of an elastic constant $C_{56}$ and a phase maximum value of a high-order mode.

FIG. 11 is a graph showing a relationship between a magnitude of the elastic constant $C_{56}$ and a phase maximum value of a high-order mode. When Euler angles of LiTaO$_3$ are (0°, 140°, 0°), the elastic constant $C_{56}$ is about −3.7 GPa, which is a negative value.

Therefore, when the elastic constant $C_{56}$ of the silicon single crystal has a positive value, the high-order mode is able to be reduced or prevented. As shown in FIG. 11, in a region where the value of the elastic constant $C_{56}$ of the silicon single crystal is positive, that is, greater than 0, the phase maximum value of the high-order mode is able to be reduced or prevented to a level of about −70°, for example. Accordingly, when the value of the elastic constant $C_{56}$ of the silicon single crystal is greater than 0, the high-order mode is able to be effectively reduced or prevented without depending on the magnitude of the elastic constant $C_{56}$. More preferably, it is possible to more effectively reduce or prevent the high-order mode by making the above elastic constant equal to or greater than about 1 GPa. That is, it is understood that the reduction or prevention of the high-order mode does not depend on the absolute value of the elastic constant.

Fourth Preferred Embodiment

For a fourth preferred embodiment, the film thickness of the piezoelectric body 3 made of LiTaO$_3$ was varied within a range from about 0.05λ to about 15λ in the second preferred embodiment.

Crystal orientations of LiTaO$_3$ were set to (0°, 140°, 0°) in Euler angles, and crystal orientations of a silicon single crystal were set to (−45°, −54.7°, 0°) or (−45°, −54.7°, 180°) in Euler angles.

Figure 12:
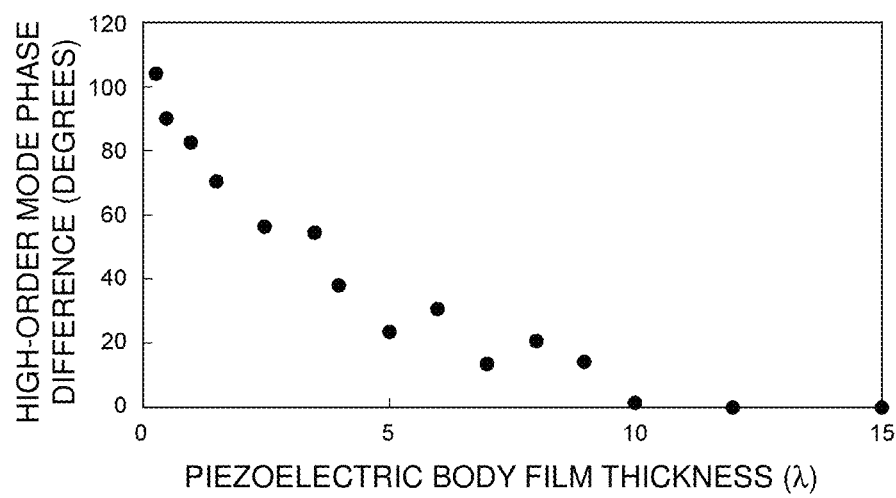
FIG. 12 is a graph showing a relationship between a film thickness of a piezoelectric body and a high-order mode phase difference.

In FIG. 12, the horizontal axis represents a film thickness of the piezoelectric body, that is, a film thickness of LiTaO$_3$, and the vertical axis represents a high-order mode phase difference (°). The high-order mode phase difference indicates a difference between the high-order mode phase difference maximum value when the Euler angles of the silicon single crystal are (−45°, −54.7°, 0°) and the high-order mode phase difference maximum value when the Euler angles of the silicon single crystal are (−45°, −54.7°, 180°). As a difference in the high-order mode phase difference is larger, the degree of improvement in the high-order mode intensity is larger.

As is apparent from FIG. 12, the thinner the film thickness of the piezoelectric body is, the larger the degree of improvement in the high-order mode is. The reason for this may be as follows: when the piezoelectric body is thin, a larger amount of energy is distributed into the material layer made of the silicon single crystal, so that the advantageous effect of reducing or preventing the high-order mode is improved.

Further, according to FIG. 12, it is understood that the advantageous effect of reducing or preventing the high-order mode is effective in a region in which the film thickness of the piezoelectric body is equal to or smaller than about 10λ. Therefore, it is preferable for the film thickness of the piezoelectric body to be equal to or smaller than about 10λ, for example.

Fifth Preferred Embodiment

Figure 13:
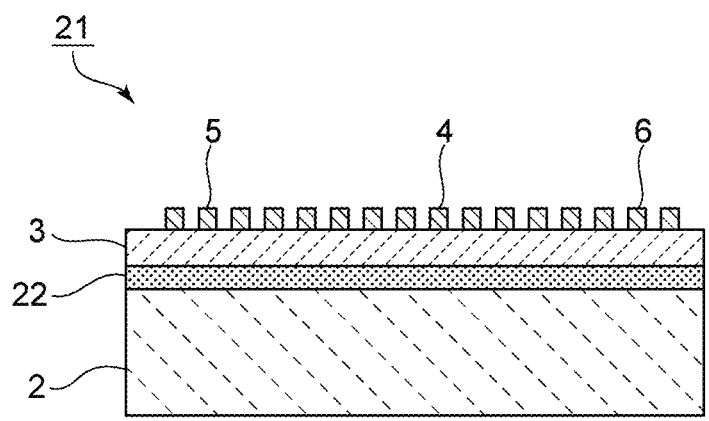
FIG. 13 is a front cross-sectional view of an acoustic wave device according to a fifth preferred embodiment of the present invention.

FIG. 13 is a front cross-sectional view of an acoustic wave device according to a fifth preferred embodiment of the present invention.

In an acoustic wave device 21, a low acoustic velocity film 22 is laminated between the material layer 2 and the piezoelectric body 3. The low acoustic velocity film 22 is made of a low acoustic velocity material in which a bulk wave propagates at a lower acoustic velocity than an acoustic velocity of an acoustic wave propagating in the piezoelectric body 3. The low acoustic velocity film 22 is preferably made of silicon oxide in the present preferred embodiment. The silicon oxide may be SiO$_2$, for example. As a material used in making the low acoustic velocity film, an appropriate material in which a bulk wave propagates at a lower acoustic velocity than an acoustic velocity of the acoustic wave propagating in the piezoelectric film may be used. As such a low acoustic velocity material, a medium mainly containing a material such as silicon oxide, glass, silicon oxynitride, tantalum oxide, or a compound obtained by adding fluorine, carbon or boron to silicon oxide may preferably be used, for example.

Also in the acoustic wave device of the fifth preferred embodiment, it is sufficient that, among the elastic constants $C_{11}$ to $C_{66}$ represented by the above-described Expression 1, the sign of at least one elastic constant not equal to 0 is inverted between the material layer 2 and the piezoelectric body 3. As the result, similarly to the first to fourth preferred embodiments, the high-order mode is able to be reduced or prevented. This will be explained in more detail based on a more specific experiment example.

In the acoustic wave device 21 of the fifth preferred embodiment, the thickness of the piezoelectric body 3 made of LiTaO$_3$ was set to about 0.3λ, for example, and the Euler angles were set to (0°, 140°, 0°). As a silicon oxide film, an SiO$_2$ film was used. The thickness of the low acoustic velocity film 22 made of the SiO$_2$ film was set to about 0.35λ. The Euler angles of a silicon single crystal used as the material layer 2 were set to (−45°, −54.7°, 0°) or (−45°, −54.7°, 180°) as in the case of the second preferred embodiment.

A wave length λ determined by the electrode finger pitch of the IDT electrode 4 was preferably about 1.0 μm, for example, the IDT electrode 4 was made of Al, and the film thickness thereof was about 0.08λ, for example.

Figure 14:
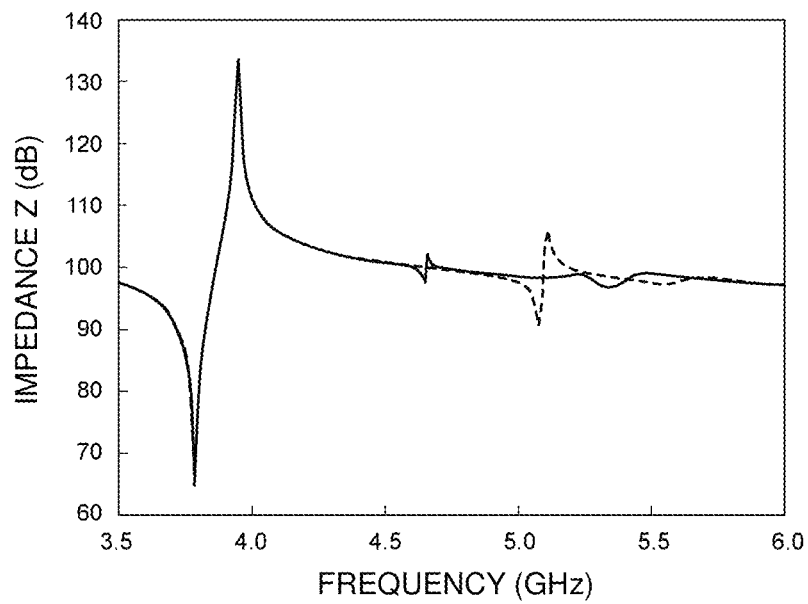
FIG. 14 is a graph showing impedance characteristics of the acoustic wave device of the fifth preferred embodiment and an acoustic wave device of a second comparative example.

In FIG. 14, a solid line indicates a result of the fifth preferred embodiment, and shows impedance characteristics in the case of the Euler angles of the silicon single crystal being (−45°, −54.7°, 180°). A broken line shows characteristics of a second comparative example, and the Euler angles of a silicon single crystal are (−45°, −54.7°, 0°). As compared with the characteristics indicated by the broken line, it is understood that, according to the characteristics indicated by the solid line, a high-order mode appearing near 5.1 GHz is able to be effectively reduced or prevented.

As described above, the low acoustic velocity film 22 may be provided between the piezoelectric body 3 and the material layer 2. In this case, by providing the low acoustic velocity film 22, the concentration of energy of the acoustic wave into the piezoelectric body 3 is able to be improved. This makes it possible to reduce the loss. In the case of the low acoustic velocity film 22 made of SiO$_2$, the frequency-temperature characteristics are able to be improved. Further, as disclosed in WO 2012/086639, by making the film thickness of the SiO$_2$ film equal to or smaller than about 2λ, it is possible to adjust the electromechanical coupling coefficient.

Sixth Preferred Embodiment

Figure 15:
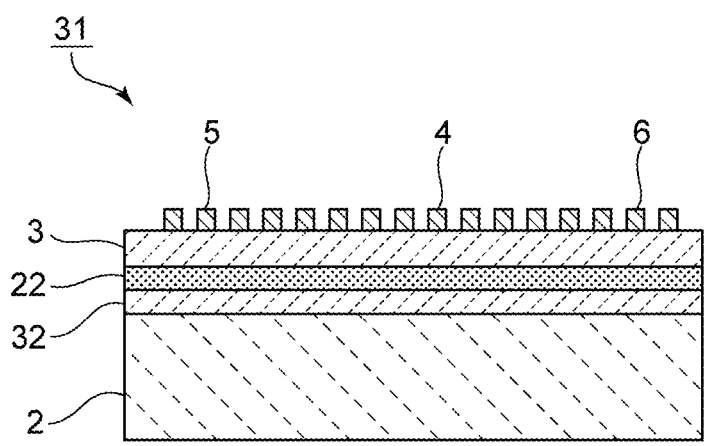
FIG. 15 is a front cross-sectional view of an acoustic wave device according to a sixth preferred embodiment of the present invention.

FIG. 15 is a front cross-sectional view of an acoustic wave device according to a sixth preferred embodiment of the present invention. In an acoustic wave device 31, a high acoustic velocity film 32 is preferably laminated between the low acoustic velocity film 22 and the material layer 2. Other elements of the acoustic wave device 31 are preferably the same or similar to those of the acoustic wave device 21. The high acoustic velocity film 32 is made of a high acoustic velocity material in which a bulk wave propagates at a higher acoustic velocity than an acoustic velocity of an acoustic wave propagating in the piezoelectric body 3. Such a high acoustic velocity material is not particularly limited as long as it satisfies the acoustic velocity relationship described above. Although the low acoustic velocity film 22 may be made of the appropriate low acoustic velocity material described above, the low acoustic velocity film 22 is preferably made of silicon oxide in the present preferred embodiment, for example. In addition, the high acoustic velocity film 32 is preferably made of silicon nitride, for example.

As a high acoustic velocity material for the high acoustic velocity film 32, aluminum nitride, aluminum oxide, silicon carbide, silicon nitride, silicon oxynitride, silicon, sapphire, lithium tantalate, lithium niobate, quartz crystal, alumina, zirconia, cordierite, mullite, steatite, forsterite, magnesia, a DLC film or diamond, a medium mainly containing these materials, a medium mainly containing a mixture of these materials, or the like may preferably be used, for example.

In this manner, even in the acoustic wave device 31 in which the high acoustic velocity film 32 is further laminated, it is sufficient that at least one elastic constant among elastic constants $C_{41}$ to $C_{43}$, $C_{51}$ to $C_{54}$ and $C_{61}$ to $C_{65}$, and elastic constants at symmetrical positions relative to the above elastic constants of the material layer 2, and at least one elastic constant among elastic constants $C_{41}$ to $C_{43}$, $C_{51}$ to $C_{54}$ and $C_{61}$ to $C_{65}$, and elastic constants at symmetrical positions relative to the above elastic constants of the piezoelectric body 3 have the opposite signs to each other. With this, it is possible to reduce or prevent the high-order mode. This is shown in FIGS. 16 and 17.

The film thickness of the high acoustic velocity film made of silicon nitride was preferably set to about 0.45λ, for example. The Euler angles of LiTaO$_3$ were set to (0°, 140°, 0°), and the Euler angles of the silicon single crystal were preferably set to (−45°, −54.7°, 180°) in the sixth preferred embodiment. Other elements were the same or substantially the same as those of the fifth preferred embodiment, and then the acoustic wave device of the sixth preferred embodiment was prepared. For comparison, the acoustic wave device of the fifth preferred embodiment was prepared.

Figure 16:
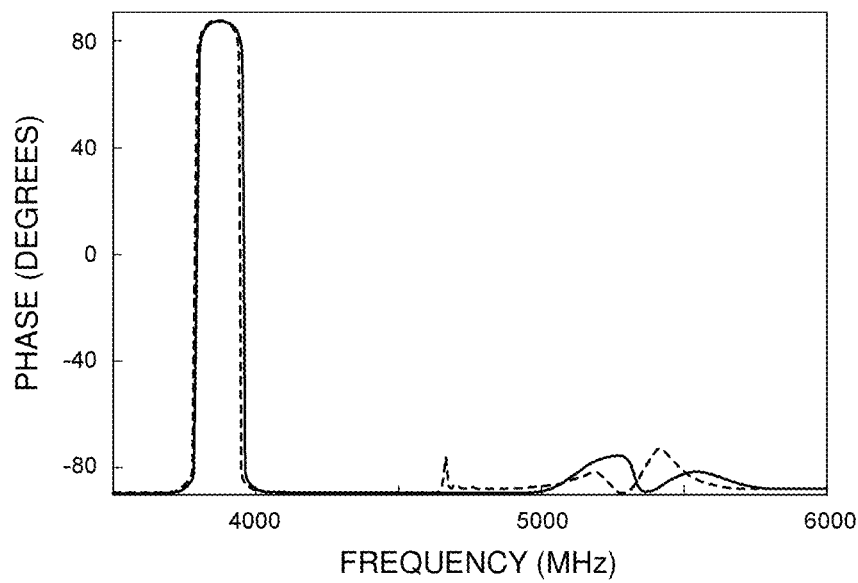
FIG. 16 is a graph showing phase characteristics of the acoustic wave device of the fifth preferred embodiment and the acoustic wave device of the sixth preferred embodiment. of the present invention.
Figure 17:
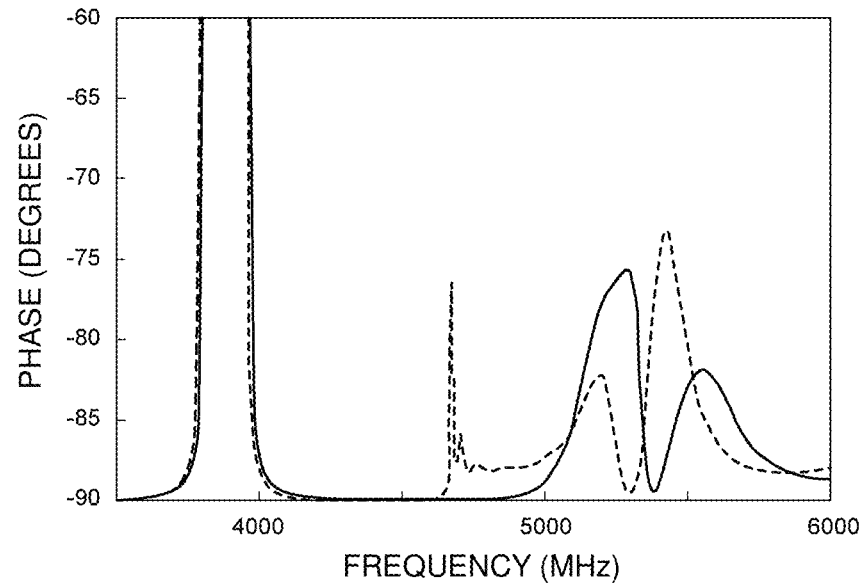
FIG. 17 is a graph in which a portion of the graph in FIG. 16 is enlarged and illustrated.

FIG. 16 and FIG. 17 are graphs showing phase characteristics of the acoustic wave device of the fifth preferred embodiment and the acoustic wave device of the sixth preferred embodiment. In FIGS. 16 and 17, a solid line indicates a result of the sixth preferred embodiment, and a broken line indicates a result of the fifth preferred embodiment. According to the characteristics of the solid line, in comparison with the characteristics of the broken line, it is understood that a high-order mode near about 4600 to about 4700 MHz is able to be reduced or prevented. In addition, since the phase characteristic near about 4700 to about 5000 MHz is close to about −90°, reduction in loss is also able to be achieved. Moreover, a high-order mode with a weak response is generated near about 5000 to about 6000 MHz. However, the peak itself of the response of the high-order mode (phase maximum value) is small as compared with the case where no silicon nitride film is provided.

In other words, it is understood that, by providing the high acoustic velocity film 32, the high-order modes is able to be reduced or prevented even more effectively.

Seventh Preferred Embodiment

Figure 18:
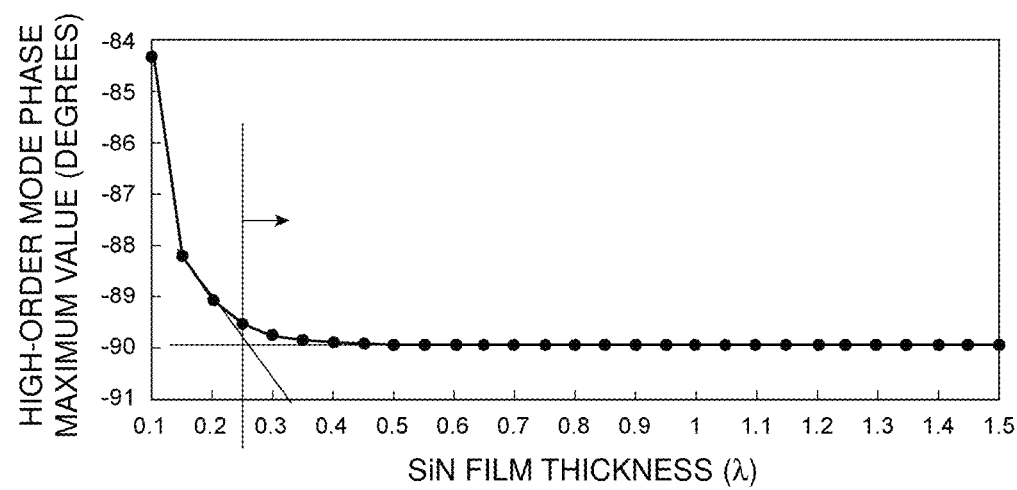
FIG. 18 is a graph showing a relationship between a film thickness of a silicon nitride film and a high-order mode phase maximum value in an acoustic wave device of a seventh preferred embodiment of the present invention.

As a seventh preferred embodiment of the present invention, the film thickness of the silicon nitride film as the high acoustic velocity film 32 was varied in the acoustic wave device 31 of the sixth preferred embodiment. FIG. 18 is a graph showing a relationship between a film thickness of the silicon nitride film and a phase maximum value of a high-order mode.

Figure 19:
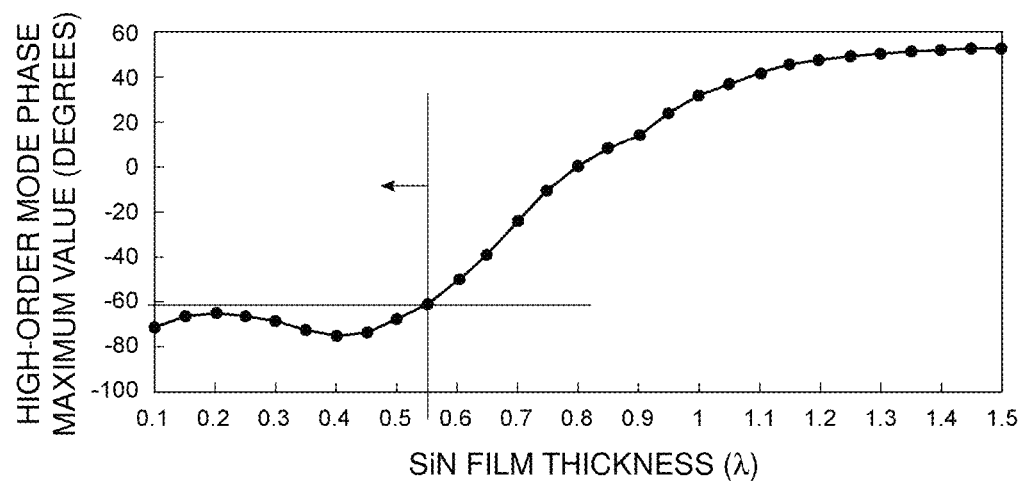
FIG. 19 is a graph showing a relationship between a film thickness of a silicon nitride film and a phase maximum value of a high-order mode.

As is apparent from FIG. 18, when the film thickness of the silicon nitride film is equal to or greater than about 0.25λ, the intensity of the high-order mode is reduced to approximately −90°. Therefore, it is preferable for the film thickness of the silicon nitride film to be equal to or greater than about 0.25λ, for example. FIG. 19 is a graph showing a variation of the phase maximum value of a high-order mode generated in a band of about 4000 MHz to about 6000 MHz when the film thickness of the silicon nitride film is varied.

As is apparent from FIG. 19, when the film thickness of the silicon nitride film is equal to or smaller than about 0.55λ, the phase of the high-order mode appearing at about 4000 MHz to about 6000 MHz is able to be made smaller than about −60°.

Therefore, in order to reduce or prevent a level of the whole high-order mode while reducing or preventing a high-order mode closest to the main mode, it is understood that the film thickness of the silicon nitride film preferably falls within a range from about 0.25λ to about 0.55λ, for example.

Figure 20:
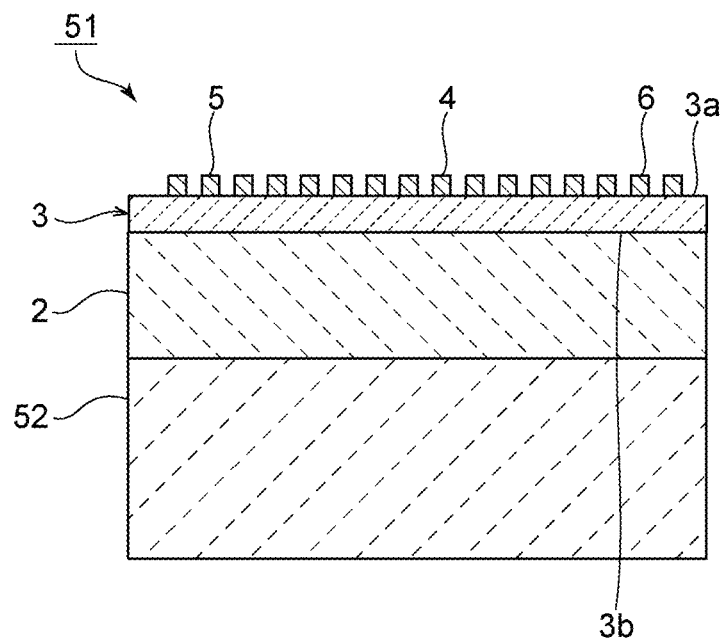
FIG. 20 is a front cross-sectional view of an acoustic wave device according to a modification of the first preferred embodiment of the present invention.

FIG. 20 is a front cross-sectional view of an acoustic wave device according to a modification of the first preferred embodiment. In an acoustic wave device 51 illustrated in FIG. 20, a support substrate 52 is preferably laminated on a surface of the material layer 2 opposing to a surface which is in contact with the piezoelectric body 3. In this manner, the support substrate 52 supporting the material layer 2 may be further provided. The material defining the support substrate 52 is not particularly limited, and appropriate insulating ceramics such as, for example, alumina and silicon, a metal, and the like, for example, may be used.

Eighth Preferred Embodiment

A lamination structure of an acoustic wave device according to an eighth preferred embodiment of the present invention is the same as or similar to that of the acoustic wave device of the first preferred embodiment. Note that, however, the lamination structure is as follows. A piezoelectric body made of LiTaO$_3$ having a thickness of about 0.3λ, for example, is laminated on a material layer made of silicon having a thickness of about 0.1λ, for example. An IDT electrode made of, for example, Al having a thickness of about 0.08λ is provided on the piezoelectric body. The Euler angles of LiTaO$_3$ were set to (0°, 140°, 0°), and the Euler angles of silicon were set to (−45°, −54.7°, 180°) in the eighth preferred embodiment. Further, as a third comparative example, an acoustic wave device was manufactured in the same or similar manner as in the eighth preferred embodiment, except that the Euler angles of silicon were (−45°, −54.7°, 0°). A simulation was performed in which the lower surface of the material layer made of silicon was taken as a non-reflective absorption end, so that a response of a high-order mode was examined.

Figure 22:
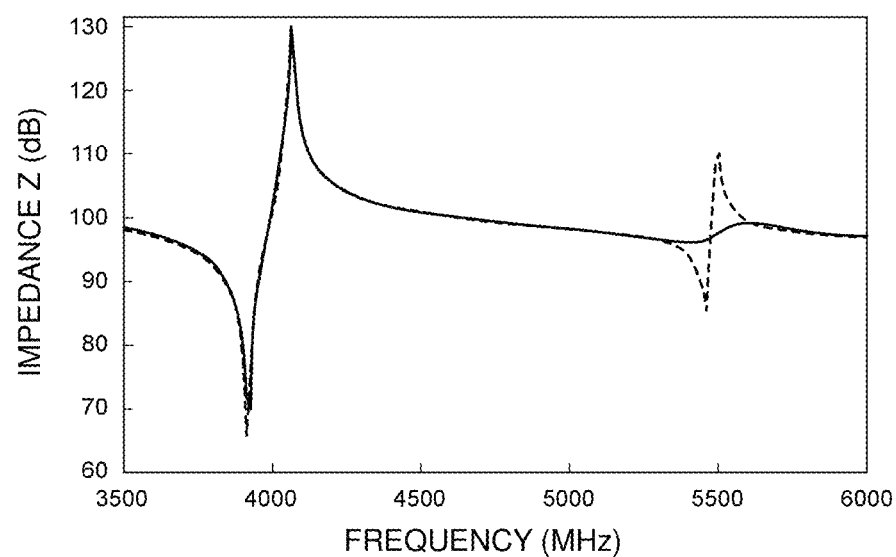
FIG. 22 is a graph showing impedance characteristics of an acoustic wave device of an eighth preferred embodiment of the present invention and an acoustic wave device of a third comparative example.

In FIG. 22, a solid line indicates a result of the eighth preferred embodiment, and a broken line indicates a result of the third comparative example. Also in the eighth preferred embodiment, the elastic constants preferably have the opposite signs to each other in the piezoelectric body and the material layer. Because of this, as is apparent from FIG. 22, it is understood that the high-order mode is able to be effectively reduced or prevented. Thus, the material layer may be a thin material layer, rather than a thick support substrate. Further, as in the eighth preferred embodiment, a high-order mode is able to be reduced or prevented even in the structure where a plate wave mode is excited.

Ninth Preferred Embodiment

Figure 23:
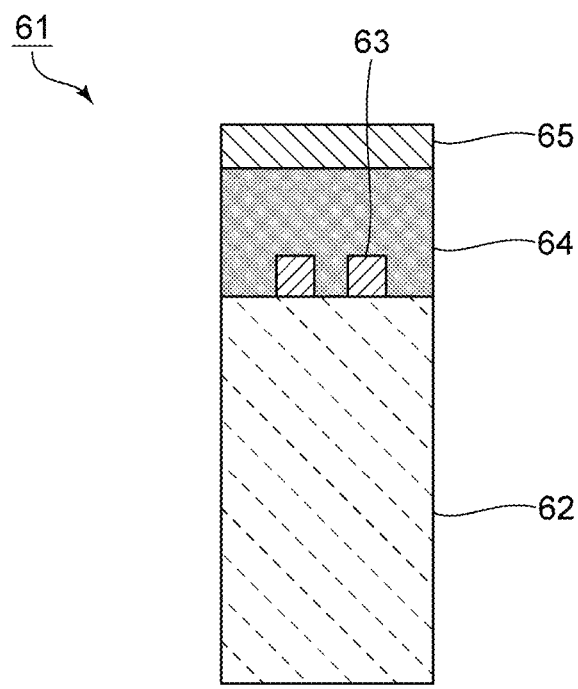
FIG. 23 is a front cross-sectional view of an acoustic wave device according to a ninth preferred embodiment of the present invention.

FIG. 23 is a front cross-sectional view of an acoustic wave device according to a ninth preferred embodiment of the present invention. An acoustic wave device 61 preferably includes a piezoelectric body 62 made of, for example, lithium niobate of about 126.5° Y cut, for example. An IDT electrode 63 is preferably provided on the piezoelectric body 62. The IDT electrode 63 is a laminated metal film in which an Al film was laminated on a Pt film. The thickness of the Al film is preferably about $0.06\lambda$, and the thickness of the Pt film was preferably about $0.02\lambda$, for example.

A silicon oxide film ($SiO_2$ film) 64 having a thickness of about $0.3\lambda$, for example, is preferably laminated to cover the IDT electrode 63, and a material layer 65 made of silicon is preferably laminated on a silicon oxide film 64. In this manner, the material layer 65 is indirectly laminated on a principal surface of the piezoelectric body 62 on which the IDT electrode 63 is disposed. In the ninth preferred embodiment, the Euler angles of silicon are set to (−45°, −54.7°, 180°). As a fourth comparative example, an acoustic wave device is manufactured in the same or similar manner as in the ninth preferred embodiment, except that the Euler angles of silicon (−45°, −54.7°, 0°).

Figure 24:
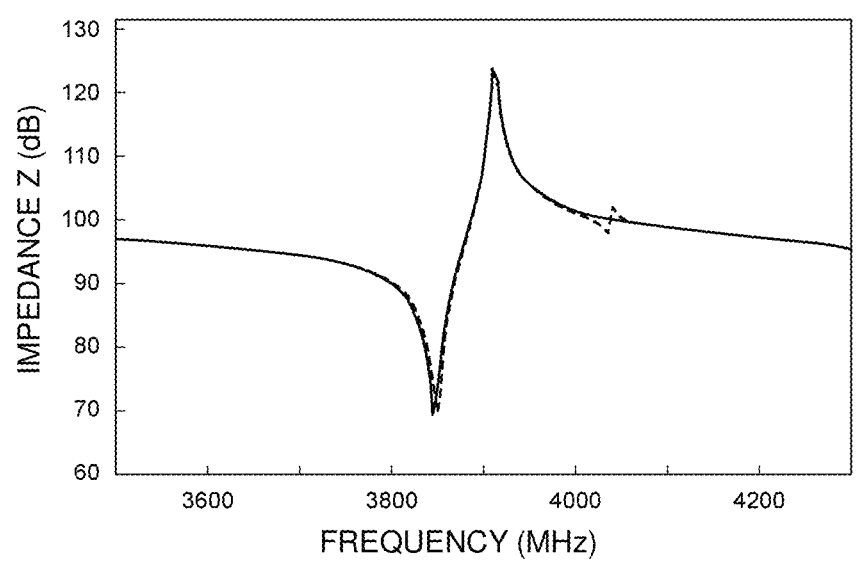
FIG. 24 is a graph showing a response of a high-order mode in the case where a Rayleigh wave propagating through lithium niobate is used in each of the ninth preferred embodiment and a fourth comparative example.

FIG. 24 is a graph showing a response of a high-order mode in the case where a Rayleigh wave propagating through lithium niobate is used in each of the ninth preferred embodiment and a fourth comparative example. In FIG. 24, as indicated by a broken line, a response of a high-order mode appears strongly near 4040 MHz in the fourth comparative example, whereas in the ninth preferred embodiment, as indicated by a solid line, it is understood that a response of a high-order mode hardly appears. From FIG. 24, it is understood that, also in this case, the high-order mode is able to be reduced or prevented by making the elastic constants of the piezoelectric body and the material layer have the opposite signs to each other.

It is preferable for a film thickness of the piezoelectric body made of a $LiTaO_3$ film to be equal to or smaller than about $3.5\lambda$, for example. In this case, the Q value becomes higher than that in the case where the film thickness exceeds about $3.5\lambda$. It is more preferable that, in order to further raise the Q value, the film thickness of the $LiTaO_3$ film be equal to or smaller than about $2.5\lambda$, for example.

When the film thickness of the piezoelectric body is equal to or smaller than about $2.5\lambda$, the absolute value of the temperature coefficient of frequency TCF is able to be made smaller than that in the case of exceeding about $2.5\lambda$. It is more preferable that the film thickness be equal to or smaller than about $2\lambda$, for example, and in this case, the absolute value of the temperature coefficient of frequency TCF may be obtained as equal to or smaller than about 10 ppm/° C. In order to reduce the absolute value of the temperature coefficient of frequency TCF, it is further preferable to make the film thickness of the piezoelectric body equal to or smaller than about $1.5\lambda$, for example.

In order to widen an adjustment range of the electromechanical coupling coefficient and the fractional bandwidth, it is preferable for the film thickness of the $LiTaO_3$ film to fall within a range from equal to or greater than about $0.05\lambda$ to equal to or smaller than about $0.5\lambda$, for example.

A film made of various high acoustic velocity materials may be laminated, as a high acoustic velocity film, on a surface of the silicon oxide film opposing to the piezoelectric body. In this case, a silicon nitride film, an aluminum oxide film, a DLC film, or the like, for example, may be used as the high acoustic velocity film.

Note that in this case, it has been confirmed that the electromechanical coupling coefficient and the acoustic velocity hardly change even when the material of the high acoustic velocity film and the film thickness of the silicon oxide film are changed. In particular, when the film thickness of the silicon oxide film is equal to or greater than about $0.1\lambda$ and equal to or smaller than about $0.5\lambda$, for example, the electromechanical coupling coefficient is hardly changed regardless of the material of the high acoustic velocity film. When the film thickness of the silicon oxide film is equal to or greater than about $0.3\lambda$ and equal to or smaller than about $2\lambda$, for example, the acoustic velocity does not change regardless of the material of the high acoustic velocity film. Therefore, it is preferable for the film thickness of the low acoustic velocity film made of silicon oxide to be equal to or smaller than about $2\lambda$, and more preferable to be equal to or smaller than about $0.5\lambda$, for example.

The acoustic wave devices of preferred embodiments of the present invention may be an acoustic wave resonator or a band-pass acoustic wave filter, and the electrode structure of the acoustic wave device is not particularly limited.

Figure 26:
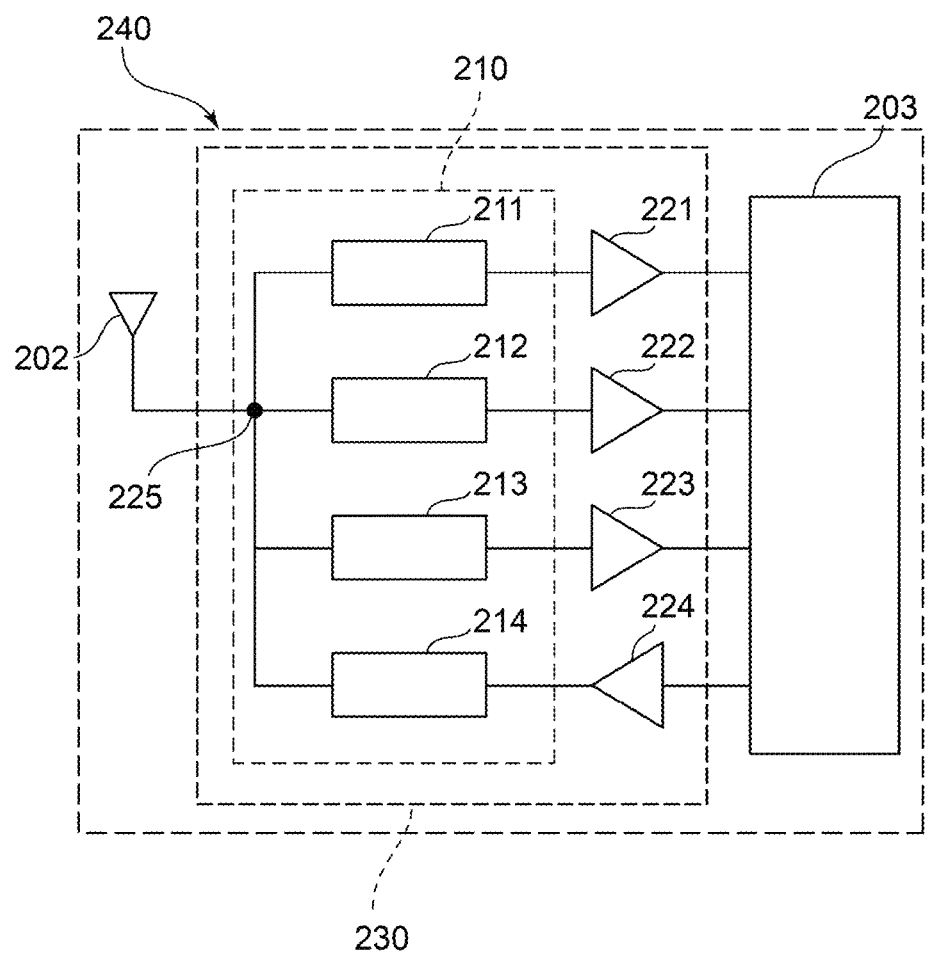
FIG. 26 is a schematic configuration diagram of a communication apparatus including a high frequency front end circuit.

FIG. 26 is a schematic configuration diagram of a communication apparatus including a high frequency front end circuit. A communication apparatus 240 preferably includes an antenna 202, a high frequency front end circuit 230, and an RF signal processing circuit 203. The high frequency front end circuit 230 is preferably a circuit section connected to the antenna 202. The high frequency front end circuit 230 preferably includes a multiplexer 210 and amplifiers 221 to 224. The multiplexer 210 preferably includes first to fourth filters 211 to 214. The acoustic wave devices according to preferred embodiments of the present invention described above may be used for the first to fourth filters 211 to 214. The multiplexer 210 preferably includes an antenna common terminal 225 connected to the antenna 202. One end of each of the first to third filters 211 to 213 as reception filters, and one end of the filter 214 as a transmission filter are connected commonly to the antenna common terminal 225. Output ends of the first to third filters 211 to 213 are connected to the amplifiers 221 to 223, respectively. The amplifier 224 is connected to an input end of the fourth filter 214.

Output ends of the amplifiers 221 to 223 are connected to the RF signal processing circuit 203. An input end of the amplifier 224 is connected to the RF signal processing circuit 203.

The multiplexer may include only a plurality of transmission filters, or may include a plurality of reception filters.

The acoustic wave devices of preferred embodiments of the present invention may be widely used in communication equipment such as mobile phones, for example, as an acoustic wave resonator, a filter, a duplexer, a multiplexer applicable to a multi-band system, a front end circuit, and a communication apparatus.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a material layer with Euler angles $(\varphi_1, \theta_1, \psi_1)$ and an elastic constant at the Euler angles $(\varphi_1, \theta_1, \psi_1)$ that is represented by:

$$\begin{pmatrix} C_{11} & C_{12} & C_{13} & C_{14} & C_{15} & C_{16} \\ C_{21} & C_{22} & C_{23} & C_{24} & C_{25} & C_{26} \\ C_{31} & C_{32} & C_{33} & C_{34} & C_{35} & C_{36} \\ C_{41} & C_{42} & C_{43} & C_{44} & C_{45} & C_{46} \\ C_{51} & C_{52} & C_{53} & C_{54} & C_{55} & C_{56} \\ C_{61} & C_{62} & C_{63} & C_{64} & C_{65} & C_{66} \end{pmatrix};$$ Expression 1 a piezoelectric body that includes first and second principal surfaces opposing each other, is laminated directly or indirectly on the material layer so that the second principal surface on a material layer side and has Euler angles ($\varphi_2$, $\theta_2$, $\psi_2$), and has an elastic constant at the Euler angles ($\varphi_2$, $\theta_2$, $\psi_2$) that is represented by Expression 1; and an IDT electrode disposed on at least one of the first principal surface and the second principal surface of the piezoelectric body; wherein at least one elastic constant among elastic constants $C_{11}$ to $C_{66}$ of the material layer not equal to 0 and at least one elastic constant among elastic constants $C_{11}$ to $C_{66}$ of the piezoelectric body not equal to 0 at a symmetrical position relative to the at least one elastic constant of the material layer have opposite signs to each other.

2. The acoustic wave device according to claim 1, further comprising a low acoustic velocity film which is disposed between the material layer and the piezoelectric body, and in which a bulk wave propagates at a lower acoustic velocity than an acoustic velocity of an acoustic wave propagating in the piezoelectric body.

3. The acoustic wave device according to claim 2, further comprising a high acoustic velocity film which is laminated between the low acoustic velocity film and the material layer, and in which a bulk wave propagates at a higher acoustic velocity than the acoustic velocity of the acoustic wave propagating in the piezoelectric body.

4. The acoustic wave device according to claim 3, wherein the high acoustic velocity film is a silicon nitride film.

5. The acoustic wave device according to claim 4, wherein a film thickness of the silicon nitride film is equal to or greater than about $0.25\lambda$ and equal to or smaller than about $0.55\lambda$.

6. The acoustic wave device according to claim 2, wherein the low acoustic velocity film is a silicon oxide film.

7. The acoustic wave device according to claim 6, wherein the low acoustic velocity film has a thickness of equal to or smaller than about $2\lambda$.

8. The acoustic wave device according to claim 1, wherein the elastic constants having the opposite signs of the material layer and the piezoelectric body are at least one of $C_{41}$ to $C_{43}$, $C_{51}$ to $C_{54}$, $C_{61}$ to $C_{65}$, $C_{14}$, $C_{24}$, $C_{34}$, $C_{15}$, $C_{25}$, $C_{35}$, $C_{45}$, $C_{16}$, $C_{26}$, $C_{36}$, $C_{46}$, and $C_{56}$ in Expression 1.

9. The acoustic wave device according to claim 8, wherein the elastic constants having the opposite signs of the material layer and the piezoelectric body include the elastic constant $C_{41}$ or $C_{14}$ in Expression 1.

10. The acoustic wave device according to claim 8, wherein the elastic constants having the opposite signs of the material layer and the piezoelectric body include the elastic constant $C_{42}$ or $C_{24}$ in Expression 1.

11. The acoustic wave device according to claim 8, wherein the elastic constants having the opposite signs of the material layer and the piezoelectric body include the elastic constant $C_{56}$ or $C_{65}$ in Expression 1.

12. The acoustic wave device according to claim 1, wherein when an elastic constant of the material layer before a rotating operation is defined as $c_{ab}^0$, the elastic constant $c_{ab}$ at the Euler angles ($\varphi_1$, $\theta_1$, $\psi_1$) is determined by an equation of $(c_{ab})=[\alpha]^{-1}[c_{ab}^0][\beta]$, and when an elastic constant of the piezoelectric body before a rotating operation is defined as $c_{ab}^1$, the elastic constant $c_{ab}$ of the piezoelectric body at the Euler angles ($\varphi_2$, $\theta_2$, $\psi_2$) is determined by an equation of $(c_{ab})=[\alpha]^{-1}[c_{ab}^1][\beta]$, and $\alpha$ and $\beta$ are:

$$\alpha = \begin{pmatrix} l_1^2 & l_2^2 & l_3^2 & 2l_2l_3 & 2l_3l_1 & 2l_1l_2 \\ m_1^2 & m_2^2 & m_3^2 & 2m_2m_3 & 2m_3m_1 & 2m_1m_2 \\ n_1^2 & n_2^2 & n_3^2 & 2n_2n_3 & 2n_3n_1 & 2n_1n_2 \\ m_1n_1 & m_2n_2 & m_3n_3 & m_2n_3+m_3n_2 & m_3n_1+m_1n_3 & m_1n_2+m_2n_1 \\ n_1l_1 & n_2l_2 & n_3l_3 & n_2l_3+n_3l_2 & n_3l_1+n_1l_3 & n_1l_2+n_2l_1 \\ l_1m_1 & l_2m_2 & l_3m_3 & l_2m_3+l_3m_2 & l_3m_1+l_1m_3 & l_1m_2+l_2m_1 \end{pmatrix}$$

$$\beta = \begin{pmatrix} l_1^2 & l_2^2 & l_3^2 & l_2l_3 & l_3l_1 & l_1l_2 \\ m_1^2 & m_2^2 & m_3^2 & m_2m_3 & m_3m_1 & m_1m_2 \\ n_1^2 & n_2^2 & n_3^2 & n_2n_3 & n_3n_1 & n_1n_2 \\ 2m_1n_1 & 2m_2n_2 & 2m_3n_3 & m_2n_3+m_3n_2 & m_3n_1+m_1n_3 & m_1n_2+m_2n_1 \\ 2n_1l_1 & 2n_2l_2 & 2n_3l_3 & n_2l_3+n_3l_2 & n_3l_1+n_1l_3 & n_1l_2+n_2l_1 \\ 2l_1m_1 & 2l_2m_2 & 2l_3m_3 & l_2m_3+l_3m_2 & l_3m_1+l_1m_3 & l_1m_2+l_2m_1 \end{pmatrix};$$

where $l_1$, $l_2$, $l_3$, $m_1$, $m_2$, $m_3$, $n_1$, $n_2$, and $n_3$ are:

$l_1 = \cos\psi \cos\varphi - \cos\theta \sin\varphi \sin\psi$ $l_2 = -\sin\psi \cos\varphi - \cos\theta \sin\varphi \cos\psi$ $l_3 = \sin\theta \sin\varphi$ $m_1 = \cos\psi \sin\varphi + \cos\theta \cos\varphi \sin\psi$ $m_2 = -\sin\psi \sin\varphi + \cos\theta \cos\varphi \cos\psi$ $m_3 = -\sin\theta \cos\varphi$ $n_1 = \sin\psi \sin\theta$ $n_2 = \cos\psi \sin\theta$ $n_3 = \cos\theta$.

13. The acoustic wave device according to claim 1, wherein at least a portion of a high-order mode excited by the IDT electrode propagates through both of the material layer and the piezoelectric body.

14. The acoustic wave device according to claim 1, wherein an absolute value of the elastic constant of the material layer having the opposite sign is equal to or greater than about 1 GPa.

15. The acoustic wave device according to claim 1, wherein the material layer is made of a high acoustic velocity material in which a bulk wave propagates at a higher acoustic velocity than an acoustic velocity of an acoustic wave propagating in the piezoelectric body.

16. The acoustic wave device according to claim 1, wherein the material layer is made of a material other than a piezoelectric body.

17. The acoustic wave device according to claim 1, wherein the material layer is made of a single crystal.

18. The acoustic wave device according to claim 1, wherein the piezoelectric body is made of a single crystal.

19. The acoustic wave device according to claim 1, wherein the piezoelectric body has a thickness of equal to or smaller than about $10\lambda$.

20. The acoustic wave device according to claim 1, wherein the material layer is made of silicon.

* * * * *